United States Patent
Kawakita

(10) Patent No.: US 9,566,875 B2
(45) Date of Patent: Feb. 14, 2017

(54) METHOD OF DETECTING BATTERY CAPACITY OF SECONDARY BATTERY

(75) Inventor: Koji Kawakita, Utsunomiya (JP)

(73) Assignee: HONDA MOTOR CO., LTD., Tokyo (JP)

(*) Notice: Subject to any disclaimer, the term of this patent is extended or adjusted under 35 U.S.C. 154(b) by 737 days.

(21) Appl. No.: 13/637,946

(22) PCT Filed: Mar. 11, 2011

(86) PCT No.: PCT/JP2011/055821
§ 371 (c)(1),
(2), (4) Date: Sep. 27, 2012

(87) PCT Pub. No.: WO2011/122310
PCT Pub. Date: Oct. 6, 2011

(65) Prior Publication Data
US 2013/0013238 A1   Jan. 10, 2013

(30) Foreign Application Priority Data

Mar. 30, 2010 (JP) .................. 2010-076559

(51) Int. Cl.
- B60L 11/18 (2006.01)
- H02J 7/04 (2006.01)
- G01R 31/36 (2006.01)

(52) U.S. Cl.
CPC ............ B60L 11/1861 (2013.01); H02J 7/044 (2013.01); B60L 2240/549 (2013.01);
(Continued)

(58) Field of Classification Search
CPC .... G01R 31/36; G01R 31/3606; H01M 10/48; H02J 7/00; H02J 7/044; H02J 7/045; B60L 2250/162
(Continued)

(56) References Cited

U.S. PATENT DOCUMENTS

| | | | |
|---|---|---|---|
| 5,789,924 A * | 8/1998 | Okada ................ | G01R 31/361 320/106 |
| 2006/0176022 A1* | 8/2006 | Namba ................ | 320/130 |
| 2008/0238371 A1* | 10/2008 | Tamezane ........... | 320/134 |

FOREIGN PATENT DOCUMENTS

| | | |
|---|---|---|
| CN | 101285874 A | 10/2008 |
| EP | 2 159 099 A1 | 3/2010 |

(Continued)

OTHER PUBLICATIONS

Chinese Office Action application No. 201180015118.6 issued Oct. 17, 2014.
(Continued)

*Primary Examiner* — Mohamed Charioui
*Assistant Examiner* — Catherine Rastovski
(74) *Attorney, Agent, or Firm* — Squire Patton Boggs (US) LLP

(57) ABSTRACT

A method detecting a battery capacity of a secondary battery, in which charging mode includes first mode including only ON state, and second mode including ON state and OFF state, the method includes: charging mode selection process of selecting the charging mode; internal resistance calculation process calculating internal resistance of secondary battery when ON state and OFF state are switched; remaining capacity calculation process calculating remaining capacity of secondary battery; remaining capacity variation amount calculation process calculating variation amount of remaining capacity from most recent full charge capacity calculation time; charged electricity amount calculation process of calculating amount of charged electricity in accordance with integrated value of current that flowed from point of time at which most recent full charge capacity is calculated; and full charge capacity detection process of detecting full charge capacity of secondary battery based on variation (Continued)

amount of remaining capacity and amount of charged electricity.

12 Claims, 12 Drawing Sheets

(52) U.S. Cl.
CPC ....... *B60L 2260/44* (2013.01); *G01R 31/3613* (2013.01); *Y02T 10/705* (2013.01); *Y02T 10/7005* (2013.01); *Y02T 10/7044* (2013.01)

(58) Field of Classification Search
USPC ............................................ 702/63; 320/130
See application file for complete search history.

(56) References Cited

FOREIGN PATENT DOCUMENTS

| EP | 2159099 | * | 3/2010 |
|----|---------|---|--------|
| JP | 7-274411 A | | 10/1995 |
| JP | H0727441 | * | 10/1995 |
| JP | 2000-150003 A | | 5/2000 |
| JP | 2001-145273 A | | 5/2001 |
| JP | 2002-142379 A | | 5/2002 |
| JP | 2003-037946 A | | 2/2003 |
| JP | 2004-064915 A | | 2/2004 |
| JP | 2007-192726 A | | 8/2007 |
| JP | 2008-241358 A | | 10/2008 |
| JP | 2009-17779 A | | 1/2009 |
| JP | 2010-19664 A | | 1/2010 |
| JP | 2010-019758 A | | 1/2010 |
| JP | 2010019664 | * | 1/2010 |

OTHER PUBLICATIONS

International Search Report, Application No. PCT/JP2011/055821 filed Jun. 14, 2011.
Japanese Office Action Notice of Reasons for Rejection application No. 2012-508198 dated Jun. 24, 2014.
Chinese Office Action application No. 201180015118.6 dated Mar. 24, 2014.
European Search Report, EP Patent Application No. 11762550.9 mailing date Jul. 30, 2013.

* cited by examiner

METHOD OF DETECTING BATTERY CAPACITY OF SECONDARY BATTERY

TECHNICAL FIELD OF THE INVENTION

The present invention relates to a method of detecting a battery capacity of a secondary battery.

Priority is claimed on Japanese Patent Application No. 2010-076559, filed Mar. 30, 2010, the content of which is incorporated herein by reference.

BACKGROUND ART

For example, a method of detecting a full charge capacity of a battery based on an integrated value of a charge and discharge current and a variation in a remaining capacity of a battery between first and second detection timings related to on and off of an ignition switch of a vehicle is disclosed in the related art (for example, refer to Patent Document 1).

In this method, the integrated value of the charge and discharge current is calculated by integrating a charge current and a discharge current of a battery. The charge current and the discharge current are detected by a current sensor between the first and second detection timings. In addition, when computing the variation in the remaining capacity, first, an open voltage of the battery is detected by a voltage sensor, for example, at each detection timing at which the charge and discharge current of the battery becomes zero. In addition, a remaining capacity corresponding to the open voltage of the battery is detected from a correspondence relationship between the open voltage, which is set in advance, of the battery and the remaining capacity. In addition, the variation in the remaining capacity is calculated from the remaining capacity at the first and second detection timings.

PRIOR ART DOCUMENTS

Patent Documents

Patent Document 1: Japanese Unexamined Patent Application, First Publication No. 2008-241358

SUMMARY OF THE INVENTION

Problems to be Solved by the Invention

However, in the method of detecting the full charge capacity according to the related art, in a case where the first and second detection timings are not limited to timings at which the charge and discharge current of the battery becomes zero, the open voltage is detected from the charge and discharge current detected by the current sensor based on a function or table in which the correspondence relationship between the charge and discharge current and the open voltage, which are set in advance, of the battery. However, when a variation in characteristics due to, for example, a variation with the elapse of time in the battery, a variation in a temperature of the battery, or the like occurs, the correspondence relationship between the charge and discharge current and the open voltage of the battery varies from the correspondence relationship that is set in advance in the function or table. Therefore, there is a problem in that a detection error of the open voltage may increase.

In addition, in the method of computing the charge and discharge current of the battery from the detection values of the charge current and the discharge current, which are output from the current sensor, of the battery, when a computation error accumulates due to, for example, a variation in an offset characteristic or a hysteresis characteristic that accompanies a variation in a temperature of the current sensor, or the like, detection accuracy of the open voltage and the full charge capacity of the battery may be deteriorated.

The invention has been made in consideration of the above-described problems, and an object of the invention is to provide a method of detecting a battery capacity of a secondary battery, which is capable of improving detection accuracy of a full charge capacity of the battery.

Means for Solving the Problems

To accomplish the object related to the problem, each aspect of the invention adopts the following process measures.

(1) A method of detecting a battery capacity of a secondary battery according to a first aspect of the invention is a method of detecting a battery capacity of a secondary battery that is mounted on an electrically driven vehicle that is capable of being charged by an external charger, in which a charging mode when the secondary battery is charged by the external charger includes a first mode including only an ON state in which a power transmission of a charging power is performed, and a second mode including the ON state and an OFF state in which the power transmission is temporarily stopped, the method includes: a charging mode selection process of selecting the charging mode while the charging by the external charger is performed; an internal resistance calculation process of calculating an internal resistance of the secondary battery by using variation amounts of a voltage and a current of the secondary battery when the ON state and the OFF state are switched from each other, in a case where the second mode is selected in the charging mode selection process; a remaining capacity calculation process of calculating an open voltage of the secondary battery based on the internal resistance and calculating a remaining capacity of the secondary battery from the open voltage that is a result of the calculation; a remaining capacity variation amount calculation process of calculating a variation amount $\Delta SOC$ ($=|SOC-SOCP|$) of the remaining capacity from a most recent full charge capacity calculation time; a charged electricity amount calculation process of calculating an amount of charged electricity in accordance with an integrated value of the current that flowed from a point of time at which the most recent full charge capacity is calculated; and a full charge capacity detection process of detecting a full charge capacity of the secondary battery based on the variation amount of the remaining capacity and the amount of the charged electricity.

(2) In addition, as a second aspect of the invention, in the method of detecting the battery capacity of the secondary battery according to the first aspect, in a case where the second mode is selected in the charging mode selection process, the charging by the external charger may be performed by transmission of the charging power having a pulse wave in which duration times of the ON state and the OFF state are different from each other, in the internal resistance calculation process, the internal resistance may be calculated whenever the ON state and the OFF state are switched from each other, and in the remaining capacity calculation process, the open voltage may be calculated using the internal resistance that is calculated in the internal resistance calculation process within one cycle of the second mode.

(3) In addition, as a third aspect of the invention, the method of detecting the battery capacity of the secondary battery according to the first aspect or the second aspect of the invention may further include a current sensor error correction process of detecting an error of a current sensor from a detection result of the current, which is output from the current sensor that detects the current of the secondary battery, in the OFF state, and performing correction by using the error, in a case where the second mode is selected in the charging mode selection process.

(4) In addition, as a fourth aspect of the invention, in the method of detecting the battery capacity of the secondary battery according to the third aspect of the invention, in the current sensor error correction process, the error may be detected whenever the ON state transitions to the OFF state, and the correction may be performed using a value that is obtained by averaging the errors that are detected within one cycle of the second mode.

(5) In addition, as a fifth aspect of the invention, in the method of detecting the battery capacity of the secondary battery according to the first aspect or the second aspect, in the full charge capacity detection process, a value, which is obtained by multiplying a present detection value of the full charge capacity that is detected based on the variation amount of the remaining capacity and the amount of the charged electricity and at least a most recent detection value of the full charge capacity by an arbitrary weighting factor, may be newly set to a present detection value of the full charge capacity.

(6) In addition, as a sixth aspect of the invention, in the method of detecting the battery capacity of the secondary battery according to the first aspect or the second aspect, in the internal resistance calculation process, a value of the internal resistance may be calculated using a variation amount of the current when the ON state and the OFF state are switched from each other, and a variation amount of a voltage, which is output from a voltage sensor that detects the voltage of the secondary battery, when the ON state and the OFF state are switched from each other.

(7) In addition, as a seventh aspect of the invention, in the method of detecting the battery capacity of the secondary battery according to the first aspect or the second aspect, in the remaining capacity calculation process, in a case where a difference between a voltage computation value, which is computed based on an equivalent circuit model, of the secondary battery and a detection result of a voltage output from a voltage sensor that detects the voltage of the secondary battery is less than or equal to a predetermined threshold value, the remaining capacity may be calculated.

Effect of the Invention

According to the method of detecting the battery capacity of the secondary battery of the first aspect of the invention, the charging mode when the secondary battery is charged by the external charger includes the ON state in which charging power is transmitted, and the OFF state (a power transmission stoppage state that may be actively performed at an appropriate timing) in which the transmission of the charging power is temporarily stopped, and the internal resistance of the secondary battery is calculated in a sequential manner when the ON state and the OFF state are switched from each other. Therefore, even when a correspondence relationship between a charge and discharge current and the open voltage of the secondary battery varies from a correspondence relationship which is set in advance in a function or a table due to a variation in characteristics of the secondary battery, a computation error due to a variation in an offset characteristic, a hysteresis characteristic, or the like may be prevented from accumulating. Therefore, detection accuracy of the open voltage and the full charge capacity of the secondary battery may be prevented from being decreased. As a result, the internal resistance of the secondary battery may be calculated with high accuracy. In addition, since the point of time at which the ON state and the OFF state are switched from each other is set as a calculation timing of the open voltage in place of a timing at which the charge and discharge current of the secondary battery becomes zero in the manner of the related art, the calculation accuracy of the open voltage may be improved.

In addition, since a main cause of disturbance, for example, a high load current or the like may be prevented during the charging by the external charger, calculation accuracy of the internal resistance, the open voltage, and the integrated charging current may be further improved compared to a case in which the open voltage or the like is detected at the detection timing in the related art. As a result, the detection accuracy of the full charge capacity of the secondary battery may be improved.

In addition, it is not necessary to stop the transmission of the charging power for a long period of time so as to detect the open voltage, and the open voltage or the like may be detected by temporarily stopping the power transmission in the OFF state. Therefore, a load state at the time of discharge at which the power is supplied to a load from the secondary battery (for example, a driving state or the like of a motor, which is driven by the secondary battery, for driving an electrically driven vehicle) may be prevented from varying.

According to the method of detecting the battery capacity of the secondary battery of the second aspect, the internal resistance is calculated whenever the ON state and the OFF state are switched from each other within one cycle of the second mode, and the charging power having a pulse wave in which duration times of the ON state and the OFF state are different from each other (pulse wave in which repetitive frequencies of the ON state and the OFF state are different) is transmitted. Therefore, for example, the internal resistance may be calculated with high accuracy based on a separate frequency corresponding to the variation in characteristics of the secondary battery, occurrence of various main causes of disturbance, or the like.

According to the method of detecting the battery capacity of the secondary battery of the third aspect of the invention, since the error of the current sensor is sequentially corrected by the detection result that is output from the current sensor at the time of the OFF state, a frequency of execution of the correction may be prevented from being decreased. Therefore, the accumulation of the error of the current sensor may be suppressed, whereby the detection accuracy of the full charge capacity of the secondary battery may be improved.

According to the method of detecting the battery capacity of the secondary battery of the fourth aspect of the invention, since the correction is performed using a value that is obtained by averaging the errors, which are detected within one cycle of the second mode of the current sensor, correction accuracy may be improved. Therefore, detection accuracy of the full charge capacity of the secondary battery may be improved.

According to the method of detecting the battery capacity of the secondary battery of the fifth aspect of the invention, a detection value of the present full charge capacity is detected by using an arbitrary weighting factor with respect to at least an immediately previous detection value and a present detection value. Therefore, followability and stability of the detection result of the full charge capacity may be selected in response to an object. As a result, for example, in a detection initial stage, the followability with respect to various present quantities of states may be prioritized by increasing the weighting factor of the present detection value. In addition, for example, in a case where the number of detection times increases, in a case where a variation in various quantities of states are significantly uneven, or the like, the stability of the detection result may be prioritized by increasing the weighting factor of the previous detection value such as an immediately previously detection value.

According to the method of detecting the battery capacity of the secondary battery of the sixth aspect of the invention, since the internal resistance value is calculated using the variation amounts of the voltage and current when the ON state and the OFF state are switched from each other, a variation in characteristics due to a variation with the elapse of time in the secondary battery, a variation in a temperature of the secondary battery, or the like may be appropriately reflected on the internal resistance value. Therefore, the internal resistance of the secondary battery may be calculated with high accuracy, whereby calculation accuracy of the open voltage based on the internal resistance and the remaining capacity based on the open voltage may be improved.

According to the method of detecting the battery capacity of the secondary battery of the seventh aspect of the invention, in a case where it is determined that the calculation accuracy and the reliability of the open voltage is a constant value or higher, the full charge capacity may be calculated, whereby the calculation accuracy and the reliability of the full charge capacity may be improved.

DESCRIPTION OF EMBODIMENTS

Hereinafter, a method of detecting a battery capacity of a secondary battery 11 according to an embodiment of the invention will be described with reference to the attached drawings.

Figure 1:
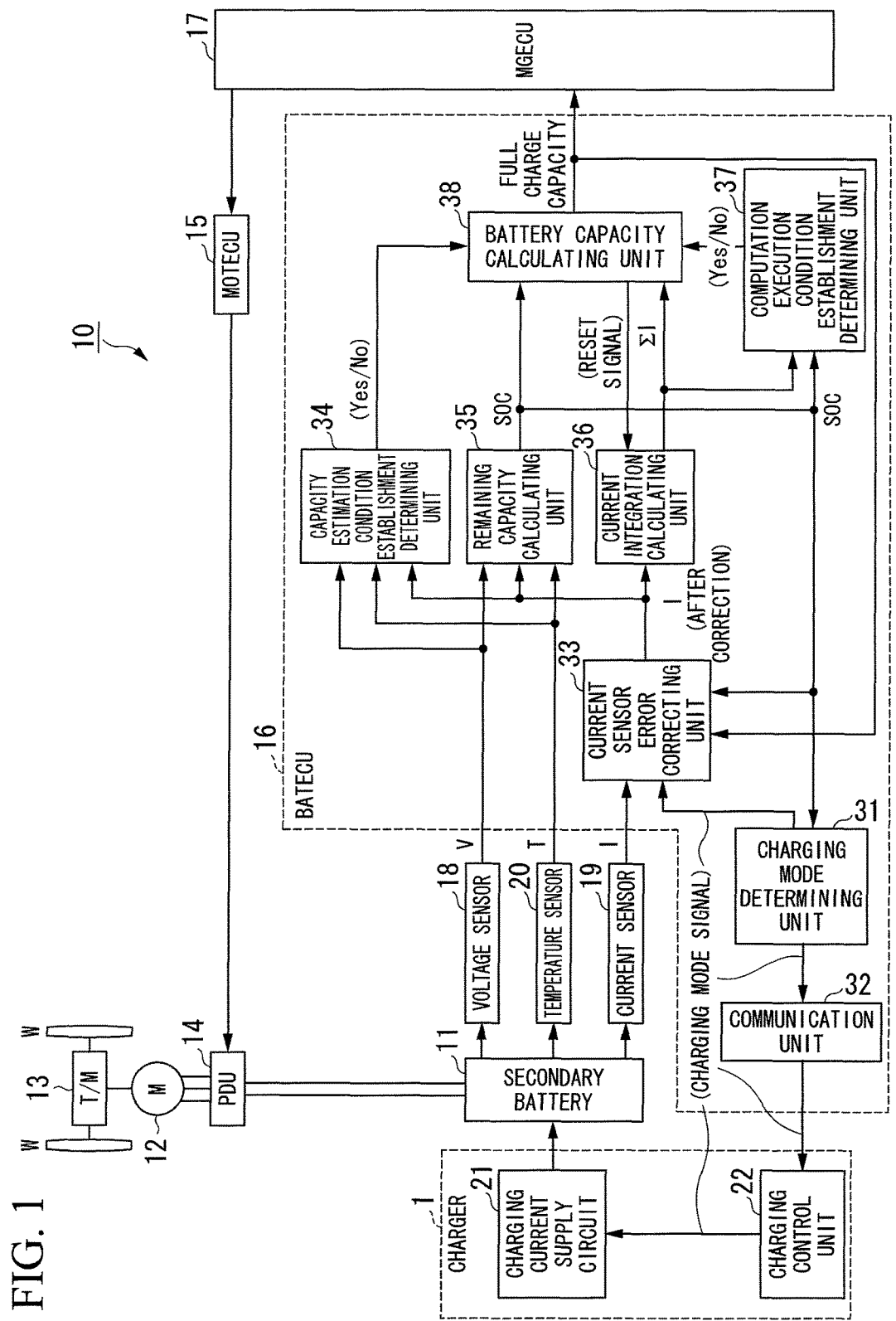
FIG. 1 is a diagram illustrating a configuration of an electrically driven vehicle according to an embodiment of the invention.

The method of detecting the battery capacity of the secondary battery 11 according to this embodiment is a method of detecting a full charge capacity of the secondary battery 11 that is mounted on an electrically driven vehicle 10 that is capable of being charged by an external charger 1, for example, as shown in FIG. 1.

The electrically driven vehicle 10 according to this embodiment includes, for example, a secondary battery 11 that makes up a power supply, a vehicle driving motor (M) 12, a transmission (TIM) 13, a power drive unit (PDU) 14, a motor ECU (MOTECU) 15, a battery ECU (BATECU) 16, a management ECU (MGECU) 17, a voltage sensor 18, a current sensor 19, and a temperature sensor 20. The motor ECU (MOTECU) 15, the battery ECU (BATECU) 16, and the management ECU (MGECU) 17 are made up by electronic circuits such as a CPU (Central Processing Unit).

In the secondary battery 11, transmission and reception of power (for example, supply power that is supplied at the time of driving the motor 12 or regeneration power that is output at the time of regeneration of the motor 12) to and from the motor 12 is performed.

As the motor 12, for example, a three-phase (U-phase, V-phase, and W-phase) DC brushless motor is used. A driving force of the motor 12 is distributed and transmitted to left and right driving wheels W, W through the transmission 13 and a differential (not shown). In addition, when the driving force is transferred to the motor 12 from the driving wheel W at the time of decelerating the electrically driven vehicle 10, the motor 12 functions as a generator, and a so-called regenerative braking force is generated, and kinetic energy of a vehicle body is recovered as electric energy.

The motor 12 is connected to the power drive unit 14, and the power drive unit 14 is also connected to the secondary battery 11.

The power drive unit 14 is provided with a PWM inverter that performs, for example, pulse width modulation (PWM). The PWM inverter is provided with a bridge circuit in which for example, switching elements that are transistors are connected to each other in a plurality of bridges manner.

The power drive unit 14 receives a control instruction that is output from the motor ECU 15 and controls the driving of the motor 12 and the regeneration thereof. The power drive unit 14 converts DC power, which is output from the secondary battery 11, to three-phase AC power and supplies the converted three-phase AC power to the motor 12, for example, at the time of driving the motor 12. In addition, the power drive unit 14 converts the three-phase AC power, which is output from the motor 12, to DC power and charges the secondary battery 11, for example, at the time of the regeneration of the motor 12.

The motor ECU (ECU: Electronic Control Unit) 15 outputs a signal that controls a power conversion operation of the power drive unit 14. For example, this signal is a pulse that is input to a gate of each transistor making up a bridge circuit of the PWM inverter of the power drive unit 14 (that is, a pulse that allows each transistor to turn on and off using a pulse width modulation). The motor ECU 15 stores a map of a duty ratio of the pulse, that is, a map (data) of the proportion of duration periods of the ON state and OFF state in advance.

The battery ECU (ECU: Electronic Control Unit) 16 monitors a state of the secondary battery 11. Specifically, for example, as described later, various quantities of state such as an internal resistance R, a remaining capacity SOC (SOC: State of charge), and a full charge capacity of the secondary battery 11 are calculated based on each detection signal that is output from the voltage sensor 18, the current sensor 19, and the temperature sensor 20.

In addition, as described later, the battery ECU 16 outputs a charging mode signal in response to the calculation result of the quantity of state such as the remaining capacity SOC. A charging operation when the charger 1 charges the secondary battery 11 is instructed by this charging mode signal.

In addition, the external charger 1 includes, for example, a charging current supply circuit 21 and a charging control unit 22.

When receiving the charging mode signal that is output from the battery ECU 16, the charging control unit 22 controls an operation (that is, an output of the charging power) of the charging current supply circuit 21 in response to the charging mode signal.

In addition, the management ECU (ECU: Electronic Control Unit) 17 controls the motor ECU 15 based on the calculation result of the quantity of state such as the remaining capacity SOC and the full charge capacity that are calculated by the battery ECU 16.

For example, the battery ECU 16 includes a charging mode determining unit 31, a communication unit 32, a current sensor error correcting unit 33, a capacity estimation condition establishment determining unit 34, a remaining capacity calculating unit 35, a current integration calculating unit 36, a computation execution condition establishment determining unit 37, and a battery capacity calculating unit 38.

The charging mode determining unit 31 generates and outputs the charging mode signal. When this charging mode signal is output, an instruction of the charging operation when the external charger 1 charges the secondary battery 11 is given.

The charging mode corresponding to various charging operations of the charger 1 includes a first mode including only an ON state in which charging power is transmitted, and a second mode including the ON state and an OFF state in which the power transmission is temporarily stopped. When the charging mode signal is output, any one of these charging modes is selected.

The first mode includes, for example, states of constant power (CP) charging in which fixed charging power such as normal rated power CPa is continuously output, constant current (CC) charging in which charging power of a fixed current is continuously output, constant voltage (CV) charging in which charging power of a fixed voltage is continuously output, and the like.

The second mode is a charging operation that includes at least the OFF state in which the stoppage of the transmission of the charging power continues, which is subsequent to the ON state in which the transmission of the charging power continues. Specifically, for example, the second mode may include the ON state and the OFF state that are alternately repeated. When being executed subsequently to the ON state of the first mode, the second mode may include only the OFF state.

In addition, in an arbitrary cycle in which the execution of the second mode continues, a frequency of a pulse wave, which corresponds to the repetition of the ON state and the OFF state, may be changed. This change of the frequency may be appropriately performed, for example, by an M-sequence signal with a pseudo-random pattern (a pseudo-white binary signal), or may be performed in response to a predetermined pattern that is set in advance. In addition, at the time of changing the frequency, for example, the duty ratio of the pulse wave, that is, the duration periods of the ON state and OFF state is changed by changing the duration time of the ON state, the duration time of the OFF state, or the duration times of the ON state and the OFF state.

Figure 2:
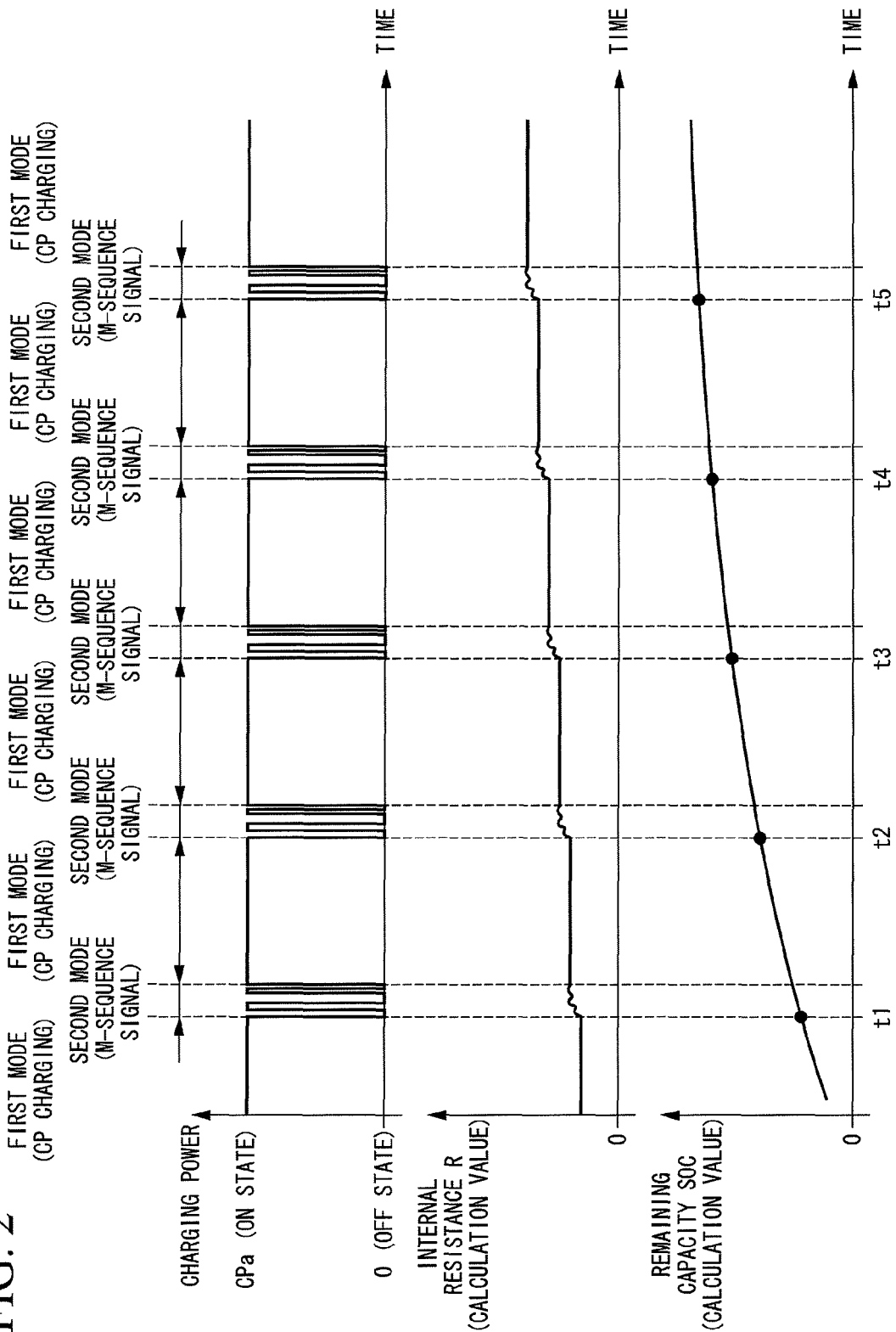
FIG. 2 is a diagram illustrating an example of charging power, and a variation with the elapse of time in an internal resistance and in a remaining capacity that are calculated in a remaining capacity calculating unit at the time of charging according to the embodiment of the invention.

For example, as shown in FIG. 2, first, the charging mode determining unit 31 instructs the execution of the first mode as a charging operation including at a normal time including a charging initiation time or the like. Subsequently, the charging mode determining unit 31 instructs the execution of the second mode over a predetermined period at a predetermined timing, in place of the first mode. For example, the predetermined timing, at which the execution of the second mode is instructed, includes a timing whenever the remaining capacity SOC reaches any one of a plurality of different predetermined values after the charging initiation time, a timing whenever a variation amount of the remaining capacity SOC reaches a predetermined variation amount after the charging initiation time, a timing for each predetermined period after the charging initiation time, or the like.

For example, in a timing chart shown in FIG. 2, as the charging operation at a normal time including the charging initiation time or the like, an instruction is given for the execution of the first mode by constant power (CP) charging in which charging power of fixed normal rated power CPa is continuously output. In addition, the execution of the second mode is instructed a timing (for example, a time t1, . . . , t5) whenever the remaining capacity SOC, which is output from a remaining capacity calculating unit 35 to be described later, increase by a predetermined amount. When the second mode is executed, the duration times of the ON state and the OFF state vary in response to the M-sequence signal.

When receiving the charging mode signal that is output from the charging mode determining unit 31, the communication unit 32 transmits this charging mode signal to the charging control unit 22 of the external charger 1.

The current sensor error correcting unit 33 detects an error (for example, an error including an offset error and a hysteresis error) of the current sensor 19 based on a detection value (current sensor output I), which is output from the current sensor 19, of the current of the secondary battery 11, and corrects this error. Then, the current sensor error correcting unit 33 outputs the current sensor output I after this error correction.

A period in which the error correction may be executed includes, for example, a first period while the charging by the external charger 1 is executed, and a second period other than the first period. In addition, at least a travel time of the electrically driven vehicle 10 is included in the second period.

At the time of the error correction in the first period, first, the execution of the second mode is instructed by the charging mode signal that is output from the charging mode determining unit 31. By this instruction, the error of the current sensor 19 is detected from the detection result of the current, which is detected by the current sensor 19 at the time of the OFF state of the second mode, of the secondary battery 11, and the error is corrected.

For example, in a timing chart shown in FIG. 3, a detection value (a current sensor output I) of a current, which is output from the current sensor 19 when an actual In the correction in the second period, for example, as shown in Table 1 shown below, a correction value KRT (n) to correct the error of the current sensor 19 is set with respect to four correction modes a to d on the basis of a variation amount (a variation amount of the remaining capacity) $\Delta SOC$ of the remaining capacity SOC, a full charge capacity CAPAdrv, and a full charge capacity CAPAchg. The variation amount (a variation amount of the remaining capacity) $\Delta SOC$ of the remaining capacity SOC is output from the remaining capacity calculating unit 35 to be described later at an appropriate timing in the second period. In addition, the full charge capacity CAPAdrv is a full charge capacity CAPA that is a calculation result that is output from the battery capacity calculating unit 38 to be described later. In addition, the full charge capacity CAPAchg is a full charge capacity CAPA that is a calculation result that is output from the battery capacity calculating unit 38 to be described later in the first period (for example, an immediate first period).

In addition, an arbitrary natural number n is the number of times in which the correction process in the second period is executed.

| CORRECTION MODE | a | b | c | d |
|---|---|---|---|---|
| $\Delta SOC$ | $\Delta SOC > 0$ | $\Delta SOC > 0$ | $\Delta SOC < 0$ | $\Delta SOC < 0$ |
| DETERMINATION VALUE OF BATTERY CAPACITY | $\frac{CAPAdrv(n)}{CAPAchg} < (1 - hys)$ | $\frac{CAPAdrv(n)}{CAPAchg} > (1 + hys)$ | $\frac{CAPAdrv(n)}{CAPAchg} > (1 + hys)$ | $\frac{CAPAdrv(n)}{CAPAchg} < (1 - hys)$ |
| CORRECTION VALUE KRT (n) | $KRT(n) = KRT(n-1) - Kg$ | $KRT(n) = KRT(n-1) + Kg$ | $KRT(n) = KRT(n-1) - Kg$ | $KRT(n) = KRT(n-1) + Kg$ | current (an actual current value) of the secondary battery 11 at a predetermined timing (for example, a time ta) of the OFF state becomes zero during the execution of the second mode, is set as an error of the current sensor 19 (for example, an offset error). In addition, the current sensor output I is newly set as a reference value Ibase that corresponds to a zero point (a position of 0 A) of the current sensor 19, thereby correcting the error. Therefore, in the OFF state in which the charging of the secondary battery 11 is stopped, the current (the detection value) that is output from the current sensor 19 becomes zero in the same manner as the actual current (the actual current value) of the secondary battery 11.

The execution of the correction in the first period is permitted when the execution of the second mode is instructed by the charging mode signal that is output from the charging mode determining unit 31. Specifically, for example, when the OFF state occurs or whenever the OFF state occurs (for example, when the ON state transitions to the OFF state), the execution of the correction in the first period is permitted.

The predetermined timing of the OFF state, at which this correction is executed, is set to a timing after a delay time (a delay time DT to be described later), which is necessary for the actual current (the actual current value) of the secondary battery 11 to become zero, has elapsed from the point of time at which the ON state transitions to the OFF state during execution of the second mode.

In addition, in a case where the error of the current sensor 19 is detected at different timings over a plurality of times in an arbitrary cycle in which the execution of the second mode continues, the correction may be performed for each error, or the correction may be performed using a value that is obtained by averaging a plurality of errors.

Figure 4:
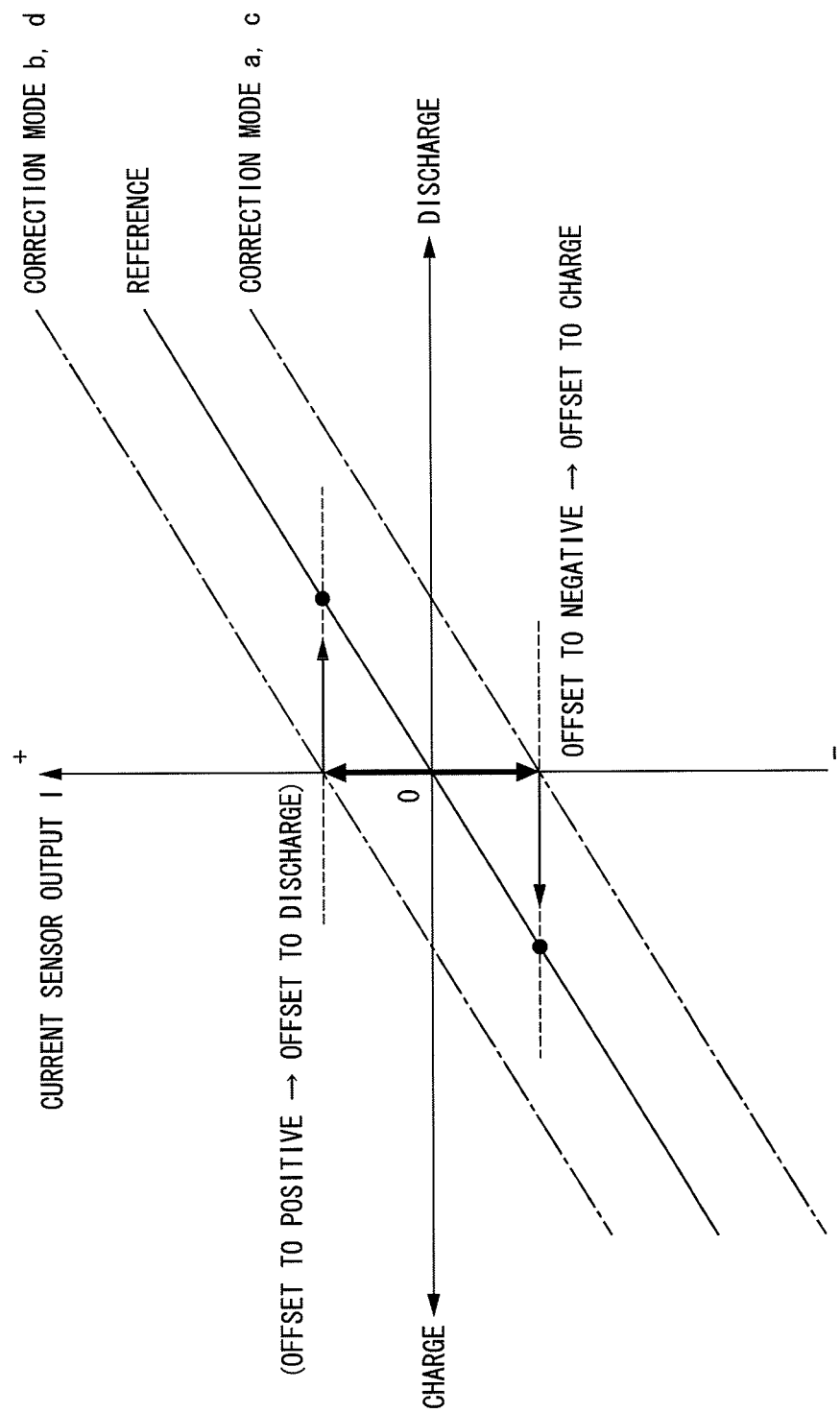
FIG. 4 is a diagram illustrating an example of a deviation of a zero point (a position of 0 A) of the current sensor according to the embodiment of the invention.

The correction mode a is set in a case where the current sensor output I is deviated to positive in the charging state of the secondary battery 11, in which the variation amount of the remaining capacity $\Delta SOC > 0$. In this case, for example, as shown in FIG. 4, the zero point of the current sensor 19 (the position of 0 A) is deviated to a discharge, such that an absolute value $|\Sigma I|$ of a current integrated value decreases compared to an appropriate value. Therefore, the full charge capacity CAPAdrv, which is calculated based on the absolute value $|\Sigma I|$ of this current integrated value, in the second period becomes smaller than the full charge capacity CAPAchg in the first period. Therefore, the correction value KRT (n) is set so as to correct the reference value Ibase, which corresponds to the zero point (the position of 0 A) of the current sensor 19, of the current sensor output I to negative.

The correction mode b is set in a case where the current sensor output I is deviated to negative in the charging state of the secondary battery 11, in which the variation amount of the remaining capacity $\Delta SOC > 0$. In this case, for example, as shown in FIG. 4, the zero point of the current sensor 19 (the position of 0 A) is deviated to charge, such that an absolute value $|\Sigma I|$ of the current integrated value increases compared to an appropriate value. Therefore, the full charge capacity CAPAdrv, which is calculated based on the absolute value $|\Sigma I|$ of this current integrated value, in the second period becomes larger than the full charge capacity CAPAchg in the first period. Therefore, the correction value KRT (n) is set so as to correct the reference value Ibase, which corresponds to the zero point (the position of 0 A) of the current sensor 19, of the current sensor output I to positive.

The correction mode c is set in a case where the current sensor output I is deviated to positive in the discharging state of the secondary battery 11, in which the variation amount of the remaining capacity ΔSOC<0. In this case, for example, as shown in FIG. 4, the zero point of the current sensor 19 (the position of 0 A) is deviated to discharge, such that an absolute value |ΣI| of the current integrated value increases compared to an appropriate value. Therefore, the full charge capacity CAPAdrv, which is calculated based on the absolute value |ΣI| of this current integrated value, in the second period becomes larger than the full charge capacity CAPAchg in the first period. Therefore, the correction value KRT (n) is set so as to correct the reference value Ibase, which corresponds to the zero point (the position of 0 A) of the current sensor 19, of the current sensor output I to negative.

The correction mode d is set in a case where the current sensor output I is deviated to negative in the discharging state of the secondary battery 11, in which the variation amount of the remaining capacity ΔSOC<0. In this case, for example, as shown in FIG. 4, the zero point of the current sensor 19 (the position of 0 A) is deviated to charge, such that an absolute value |ΣI| of the current integrated value decreases compared to an appropriate value. Therefore, the full charge capacity CAPAdrv, which is calculated based on the absolute value |ΣI| of this current integrated value, in the second period becomes smaller than the full charge capacity CAPAchg in the first period. Therefore, the correction value KRT (n) is set so as to correct the reference value Ibase, which corresponds to the zero point (the position of 0 A) of the current sensor 19, of the current sensor output I to positive.

In addition, as shown in Table 1 shown above, whether the full charge capacity CAPAdrv in the second period is larger or smaller than the full charge capacity CAPAchg in the first period is determined, for example, by determination whether a full charge capacity ratio (=CAPAdrv/CAPAchg) is larger or smaller than a value ((1+hys) or (1−hys)) having appropriate hysteresis hys with respect to "1".

In addition, in the case of correcting the reference value Ibase of the current sensor output I to negative, for example, the correction value KRT (n) in an $n^{th}$ correction process according to an arbitrary natural number n becomes a value that may be obtained by subtracting a predetermined correction gain Kg from a correction value KRT (n−1) in an immediately previous correction process. On the other hand, in the case of correcting the reference value Ibase of the current sensor output I to positive, for example, the correction value KRT (n) is set to a value that may be obtained by adding the predetermined correction gain Kg to the immediately previous correction value KRT (n−1).

In addition, the reference value Ibase (n) of the current sensor output I, which is set in the $n^{th}$ correction process by an arbitrary natural number n may be obtained, for example, by adding the correction value KRT (n) to a reference value Ibase (0) at the time of start-up of the electrically driven vehicle 10 as expressed in Expression 1 shown below.

$$Ibase(n)=Ibase(0)+KRT(n) \quad \text{[Expression 1]}$$

The capacity estimation condition establishment determining unit 34 determines whether or not a predetermined condition (a capacity estimation condition), which allows the calculation of the full charge capacity by the battery capacity calculating unit 38 to be described later, is established at an appropriate timing of a predetermined cycle or the like based on a detection value (a voltage sensor output V) of a voltage, which is output from the voltage sensor 18, of the secondary battery 11, a current sensor output I, which is output from the current sensor error correcting unit 33, after the error correction, and a detection value (a tempera-ture sensor output T) of a temperature, which is output from the temperature sensor 20, of the secondary battery 11. Then, the capacity estimation condition establishment determining unit 34 outputs a signal of this determination result.

As the capacity estimation condition, at least one or more conditions are set. In a specific method of determining the capacity, for example, the capacity estimation condition establishment determining unit 34 determines whether or not any capacity estimation condition including at least a first capacity estimation condition is established, among first to sixth capacity estimation conditions that are set sequentially from a high priority to a low priority.

For example, the first capacity estimation condition is a condition in which a difference between a computation value (for example, an open voltage (an open circuit voltage $V_0$ or the like)), which is computed on the basis of an equivalent circuit model 50 to be described later, of a voltage of the secondary battery 11 and a detection value (a voltage sensor output V), which is output from the voltage sensor 18, of a voltage of the secondary battery 11 becomes less than or equal to a predetermined threshold value.

For example, the second capacity estimation condition is a condition in which the current sensor output I, which is output from the current sensor error correcting unit 33, after the error correction becomes less than or equal to a predetermined amount of a current, or is within a range of a predetermined amount of a current.

For example, the third capacity estimation condition is a condition in which a variation amount ΔI of the current sensor output I in a predetermined period becomes less than or equal to a predetermined variation amount of a current.

For example, the fourth capacity estimation condition is a condition in which a variation amount ΔV of the voltage sensor output V in a predetermined period becomes less than or equal to a predetermined variation amount of a voltage.

For example, the fifth capacity estimation condition is a condition in which a detection value (a temperature sensor output T), which is output from the temperature sensor 20, of a temperature of the secondary battery 11 becomes greater than or equal to a predetermined temperature.

For example, the sixth capacity estimation condition is a condition in which the open voltage (the open circuit voltage) $V_0$, which is calculated by the remaining capacity calculating unit 35 to be described later, of the secondary battery 11 is within a predetermined voltage range.

The remaining capacity calculating unit 35 calculates the remaining capacity SOC of the secondary battery 11 based on the detection value (the voltage sensor output V) of the voltage, which is output from the voltage sensor 18, of the secondary battery 11, the current sensor output I, which is output from the current sensor error correcting unit 33, after the error correction, and the detection value (the temperature sensor output T), which is output from the temperature sensor 20, of the temperature of the secondary battery 11. Then, the remaining capacity calculating unit 35 outputs a signal of this calculation result.

Figure 5:
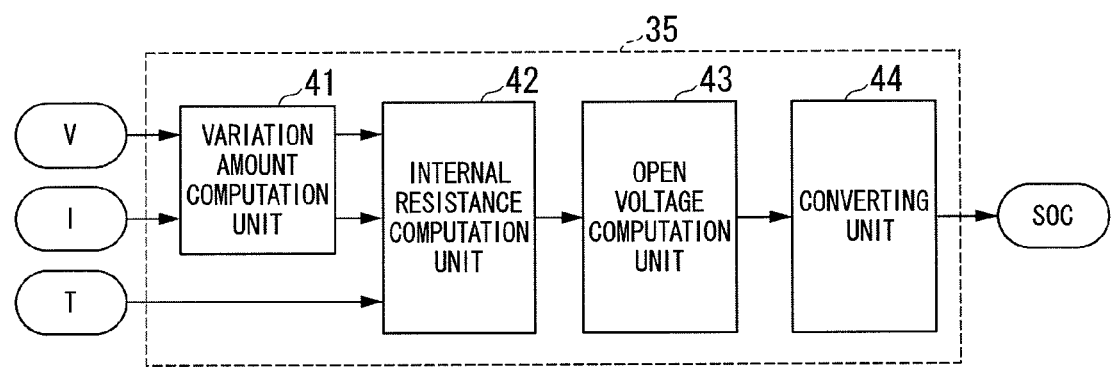
FIG. 5 is a configuration diagram of a remaining capacity calculating unit according to the embodiment of the invention.

The remaining capacity calculating unit 35 includes, for example, a variation amount computing unit 41, an internal resistance computing unit 42, an open voltage computing unit 43, and a converting unit 44 as shown in FIG. 5.

The variation amount computing unit 41 computes the variation amount ΔI of the current sensor output I after the error correction and the variation amount ΔV of the voltage sensor output V during a calculation cycle when the calculation process of the remaining capacity SOC is repeatedly executed in a predetermined calculation cycle.

For example, a variation amount ΔI (k) in a $k^{th}$ calculation process according to an arbitrary natural number k is a value that is obtained by subtracting a current sensor output I (k−1) after an immediately previous error correction from a current sensor output I (k) after error correction in the $k^{th}$ calculation process. In addition, a variation amount ΔV (k) in the $k^{th}$ calculation process is a value that is obtained by subtracting an immediately previous voltage sensor output V (k−1) from a voltage sensor output V (k) in the $k^{th}$ calculation process.

In addition, the variation amount computing unit 41 outputs variation amounts $\Delta I_f$ and $\Delta V_f$ that is obtained by performing a predetermined low-pass process with respect to the variation amounts ΔI and ΔV.

Figure 3:
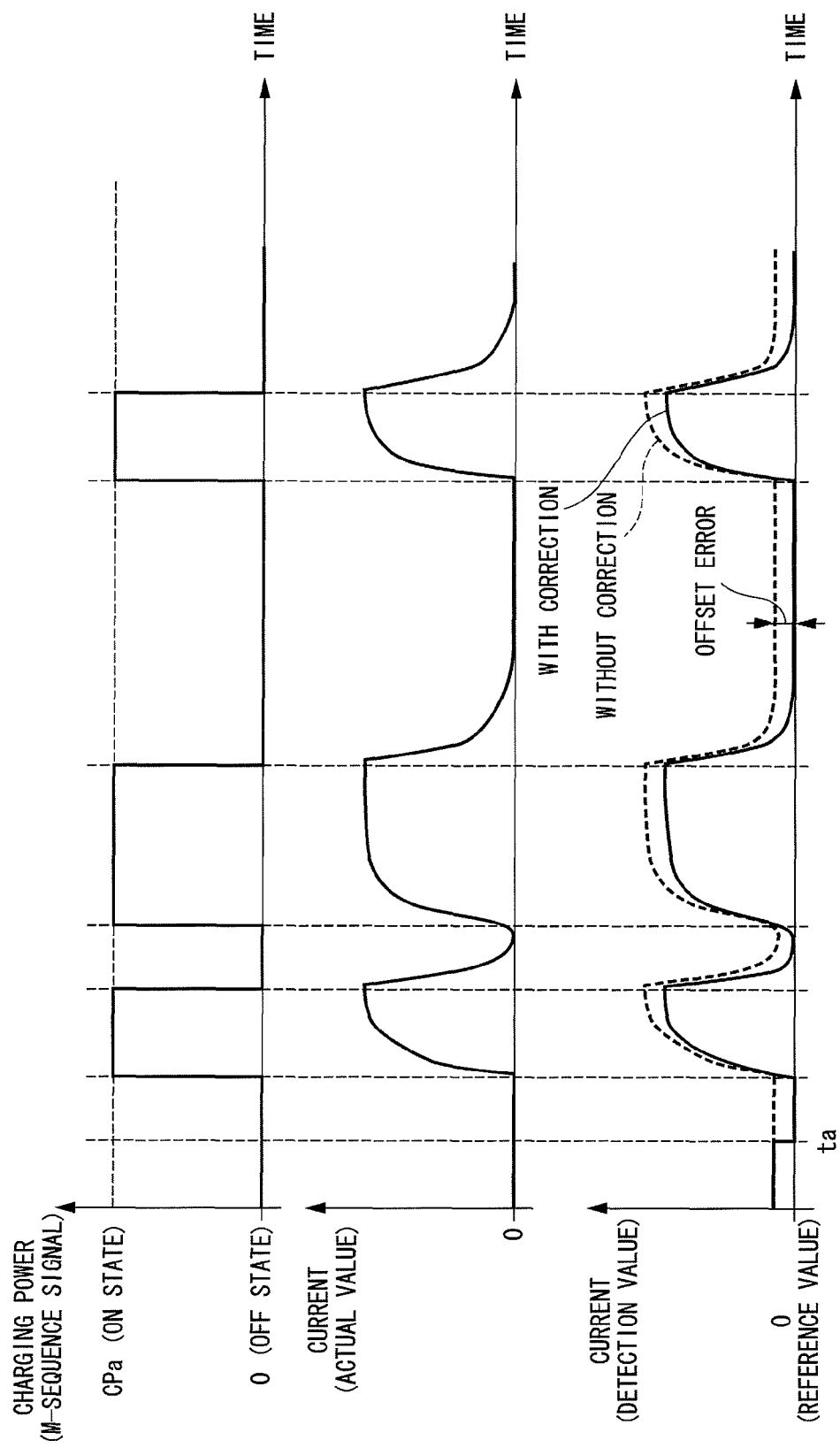
FIG. 3 is a diagram illustrating an example of charging power, and a variation with the elapse of time in an actual current of the secondary battery and a detection value of a current output from a current sensor at the time of charging according to the embodiment of the invention.

For example, as shown in FIG. 3, when execution of the second mode is instructed by the charging mode signal that is output from the charging mode determining unit 31, for example, the internal resistance computing unit 42 computes internal resistance R of the secondary battery 11 by using the variation amounts $\Delta I_f$ and $\Delta V_f$ whenever the ON state and the OFF state are switched from each other. These variation amounts $\Delta I_f$ and $\Delta V_f$ are variation amounts of a current at the time of transition from the ON state to the OFF state, or at the time of transition from the OFF state to the ON state. In addition, the value of the internal resistance R is sequentially updated by a value obtained by newly computing the internal resistance R and this computation result is output. The value of the internal resistance R is used for various processes that are executed in an appropriate timing in the battery ECU 16.

Figure 6:
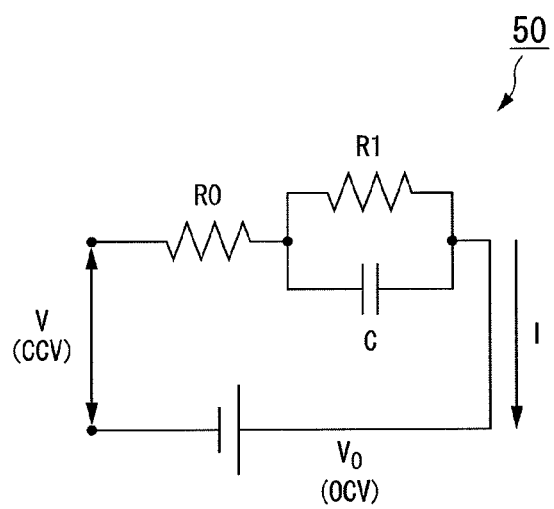
FIG. 6 is a configuration diagram of an equivalent circuit model according to the embodiment of the invention.

The internal resistance computing unit 42 computes parameter a1, b0, and b1 with an iterative least square method by using Expression (2) which is shown below by the parameters a1, b0, and b1 that are related to resistors R0 and R1 and an electrostatic capacitor C in the equivalent circuit model 50, for example, based on the equivalent circuit model 50, which is shown in FIG. 6, of the secondary battery 11. In addition, the internal resistance R of the secondary battery 11 is computed based on these parameters a1, b0, and b1.

$$\Delta V_f(k) = -a_1 \cdot \Delta V_f(k-1) + b_0 \cdot \Delta I_f(k) + b_1 \cdot \Delta I_f(k-1) \quad \text{[Expression 2]}$$

The open voltage computing unit 43 computes the open voltage $V_0$ (k) according to the arbitrary natural number k in the $k^{th}$ calculation process by using Expression (4) described below in response to the internal resistance R (that is, the most recent internal resistance R that is output from the internal resistance computing unit 42) that is computed by the internal resistance computing unit 42 and in correspondence with description of the open voltage (the open circuit voltage) $V_0$ of the secondary battery 11 as shown in Expression (3) described below. Then, the open voltage computing unit 43 outputs this computation result. In addition, the parameters a1, b0, and b1 of Expression (4) described below are parameters corresponding to the internal resistance R.

$$V_0 = V - R \times I \quad \text{[Expression 3]}$$

$$V_0(k) = \frac{1}{1+a_1}\{V(k) + a_1 V(k-1) - b_0 I(k) - b_1 I(k-1)\} \quad \text{[Expression 4]}$$

Figure 7:
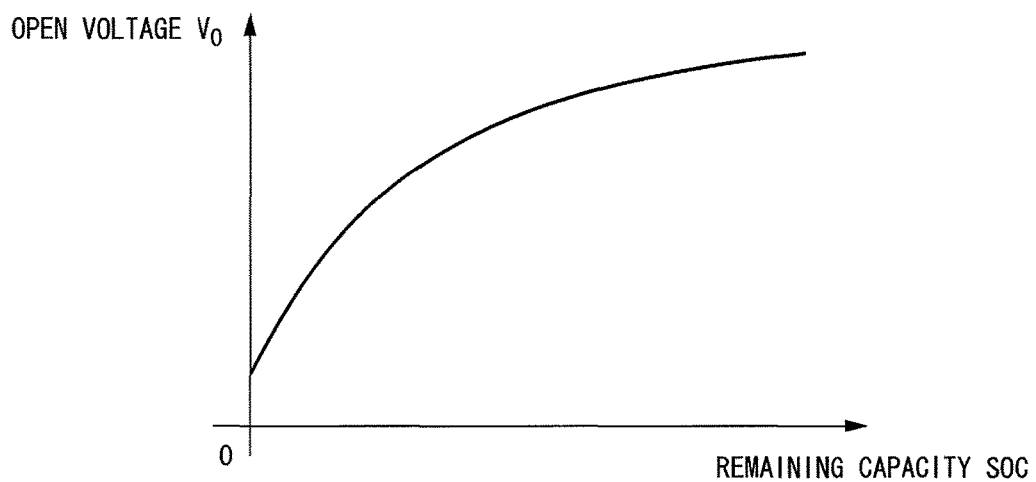
FIG. 7 is a diagram illustrating an example of a correspondence relationship between the remaining capacity and the open voltage of the secondary battery according to the embodiment of the invention.

The converting unit 44 stores data such as a predetermined map and function that represents a correspondence relationship, which is set in advance, between the open voltage $V_0$ and the remaining capacity SOC of the secondary battery 11 as shown in FIG. 7. In addition, the converting unit 44 searches this data based on the open voltage $V_0$ (k) that is computed by the open voltage computing unit 43. In addition, the converting unit 44 converts the open voltage $V_0$ (k), which is computed in the $k^{th}$ calculation process, to the remaining capacity SOC (k) and calculates the remaining capacity SOC (k) that corresponds to the open voltage $V_0$ (k). Then, the converting unit 44 outputs this calculation result as the remaining capacity SOC.

The current integration calculating unit 36 integrates the current sensor output I, which is output from the current sensor error correcting unit 33, after the error correction over a calculation cycle corresponding to a reset signal that is output from the battery capacity calculating unit 38 to be described later, and outputs an amount of electricity ΣI that is an integrated value.

In addition, when the current sensor output I is integrated during the charging by the external charger 1, this integrated value becomes an amount of charged electricity (amount of electricity) ΣI.

The computation execution condition establishment determining unit 37 determines whether or not a predetermined condition (computation execution condition) is established at appropriate timings such as a predetermined cycle based on the remaining capacity SOC that is output from the remaining capacity calculating unit 35 and the amount of electricity ΣI that is output from the current integration calculating unit 36, and outputs a signal of this determination result. When the computation execution condition is established, the battery capacity calculating unit 38 to be described later is instructed to execute the calculation of the full charge capacity.

As the computation execution condition, at least one or more conditions are set. In a specific determination method, for example, the computation execution condition establishment determining unit 37 determines whether or not all of first to fourth computation execution conditions that are set in advance are established.

For example, the first computation execution condition is a condition in which a variation amount of the remaining capacity SOC (a variation amount of the remaining capacity) ΔSOC (=|SOC−SOCP|) from the point of time (an immediately previous full charge capacity calculation time) at which the full charge capacity is calculated immediately previously by the battery capacity calculating unit 38 to be described later is greater than or equal to a predetermined variation amount of a remaining capacity. In addition, this variation amount ΔSOC is an absolute value of a difference between a remaining capacity SOC that is output from the remaining capacity calculating unit 35 at this point of time, and a remaining capacity SOCP that is output from the remaining capacity calculating unit 35 at the point of time at which the full charge capacity is calculated immediately previously.

For example, the second computation execution condition is a condition in which an amount of electricity ΣI (that is, the integrated value of the current sensor output I after the error correction) from the point of time at which the full charge capacity is calculated immediately previously by the battery capacity calculating unit 38 to be described later is greater than or equal to a predetermined amount of electricity.

For example, the third computation execution condition is a condition in which an elapsed time TT from the point of time at which the full charge capacity is calculated immediately previously by the battery capacity calculating unit 38 to be described later is within a predetermined time range (TT2≥TT≥TT1).

For example, the fourth computation execution condition is a condition in which based on the variation amount of the remaining capacity SOC (the variation amount of the remaining capacity) ΔSOC (=|SOC−SOCP|) from the point of time at which the full charge capacity is calculated immediately previously by the battery capacity calculating unit 38 to be described later, and the amount of electricity ΣI a capacity calculation value C0, which is described as shown in Expression (5) described below, is within a predetermined capacity range (C2≥C0≥C1).

$$C0 = \frac{\sum I}{\Delta SOC} \times 100 \qquad \text{[Expression 5]}$$

In a state in which the capacity estimation condition is established in the signal of the determination result that is output from the capacity estimation condition establishment determining unit 34, and when the computation execution condition is established by the signal of the determination result that is output from the computation execution condition establishment determining unit 37, the battery capacity calculating unit 38 calculates the full charge capacity of the secondary battery 11 and outputs this calculation result and a reset signal.

In the battery capacity calculating unit 38, for example, a value, which is obtained by using an arbitrary weighting factor W (0≤W≤1) with respect to a present calculation value (that is, a capacity calculation value C0) of the full charge capacity that is calculated based on the variation amount ΔSOC of the remaining capacity SOC from an immediately previous full charge capacity calculation time and the amount of electricity ΣI and a previous calculation value that is at least an immediately previous calculation value of the full charge capacity (that is, a full charge capacity CAPA (m−1) in a (m−1)$^{th}$ calculation process according to an arbitrary natural number m) by using, for example, Expression (6) described below, is set as a new present calculation value of the full charge capacity (that is, a full charge capacity CAPA (m) in an m$^{th}$ calculation process).

$$CAPA(m) = W \times CAPA(m-1) + (1-W) \times C0 \qquad \text{[Expression 6]}$$

Figure 8:
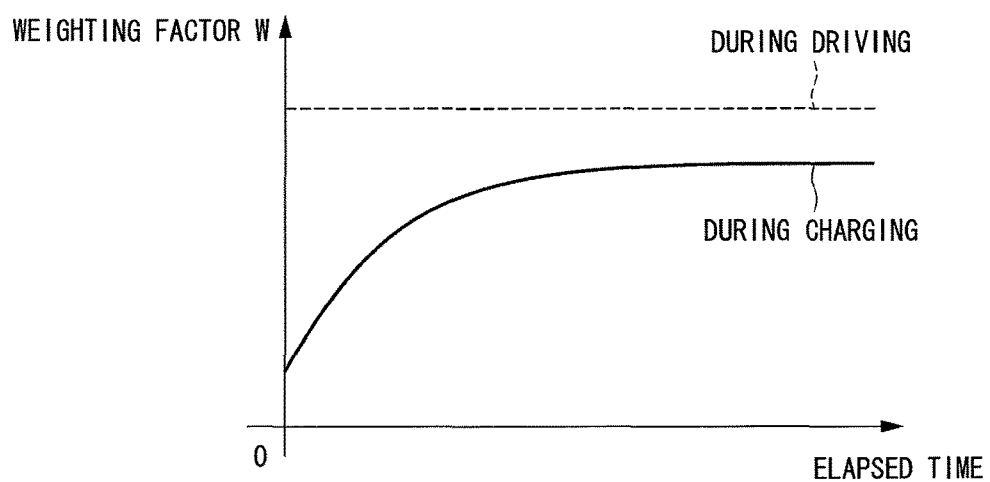
FIG. 8 is a diagram illustrating an example of a variation in a weighting factor W in correspondence with an elapsed time from a charging initiation time or a start-up time of the electrically driven vehicle according to the embodiment of the invention.

In addition, the arbitrary weighting factor W is a factor that allows that the followability and the stability of the calculation result of the full charge capacity may be selected in response to an object. Specifically, for example, as shown in FIG. 8, the weighting factor W is set in such a manner that it increasingly varies so as to approach a predetermined value less than 1 during charging the secondary battery 11 by the external charger 1 as an elapsed time from the charging initiation time increases. In addition, the weighting factor W is fixed to a predetermined value less than 1 while the electrically driven vehicle 10 travels.

Furthermore, in the battery capacity calculating unit 38, a filtering process according to an arbitrary filter coefficient F (0≤F≤1) is performed by using, for example, Expression (7) described below, and a full charge capacity CAPAF (m) after the filtering process in an m$^{th}$ calculation process is calculated by a full charge capacity CAPA (m) in the m$^{th}$ calculation process and a full charge capacity CAPAF (m−1) after the filtering process in a (m−1)$^{th}$ calculation process.

The m is an arbitrary natural number. In addition, this calculation result is output as the full charge capacity CAPA together with a reset signal.

$$CAPAF(m) = F \times CAPA(m) + (1-F) \times CAPAF(m-1) \qquad \text{[Expression 7]}$$

The electrically driven vehicle 10 according to this embodiment has the above-described configuration. Next, an operation of the battery ECU 16, particularly, a process of a method of detecting the battery capacity of the secondary battery 11, and a process of a method of correcting the error of the current sensor 19 will be described.

First, a method of processing the remaining capacity calculation to calculate the remaining capacity SOC of the secondary battery 11 will be described below.

Figure 9:
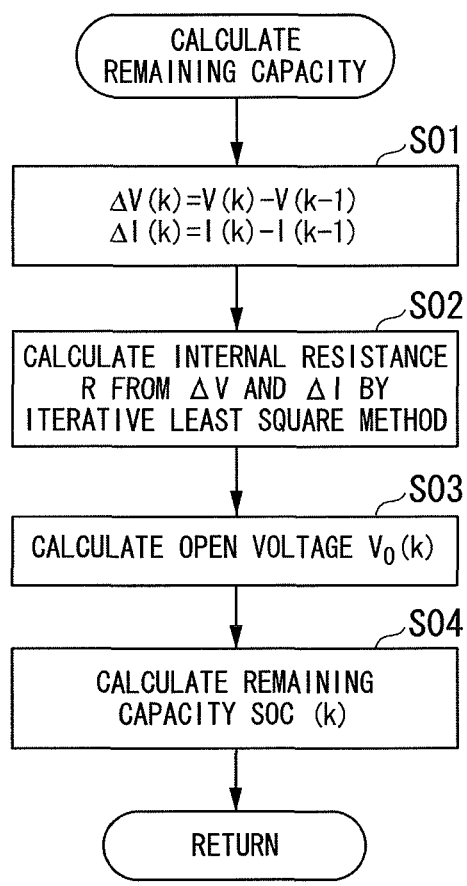
FIG. 9 is a diagram illustrating a remaining capacity calculating process according to the embodiment of the invention.

For example, in step S01 shown in FIG. 9, a variation amount ΔV (k) is calculated by subtracting an immediately previous voltage sensor output V (k−1) from a voltage sensor output V (k) in a k$^{th}$ calculation process according to an arbitrary natural number k. In addition, a variation amount ΔI (k) is calculated by subtracting an immediately previous current sensor output I (k−1) after the error correction from a current sensor output I (k) after the error correction in the k$^{th}$ calculation process by the arbitrary natural number k.

Next, in an internal resistance calculating process (step S02), the internal resistance R of the secondary battery 11 is calculated on the basis of the respective variation amounts ΔV (k) and ΔI (k) of the voltage (the voltage sensor output V) and the current (the current sensor output I) of the secondary battery 11, which are obtained whenever the ON state and the OFF state are switched from each other (for example, transition from the ON state to the OFF state, transition from the OFF state to the ON state, or the like) when the execution of the second mode is instructed by the charging mode signal that is output from the charging mode determining unit 31. In the computation of the internal resistance R, for example, an iterative least square method using Expression (2) described above is used.

Next, in the remaining capacity calculating process, first, in step S03, the open voltage V$_O$ (k) in the k$^{th}$ calculation process (k is arbitrary natural number) is computed based on the internal resistance R. Next, in step S04, the remaining capacity SOC (k) of the secondary battery 11 in the k$^{th}$ calculation process is calculated based on the open voltage V$_O$ (k), and the process proceeds to return.

Hereinafter, a charging mode selection process of selecting the charging mode during the execution of the charging by the external charger will be described.

In addition, this process is repeatedly executed, for example, in a predetermined computation cycle Ts (s).

Figure 10:
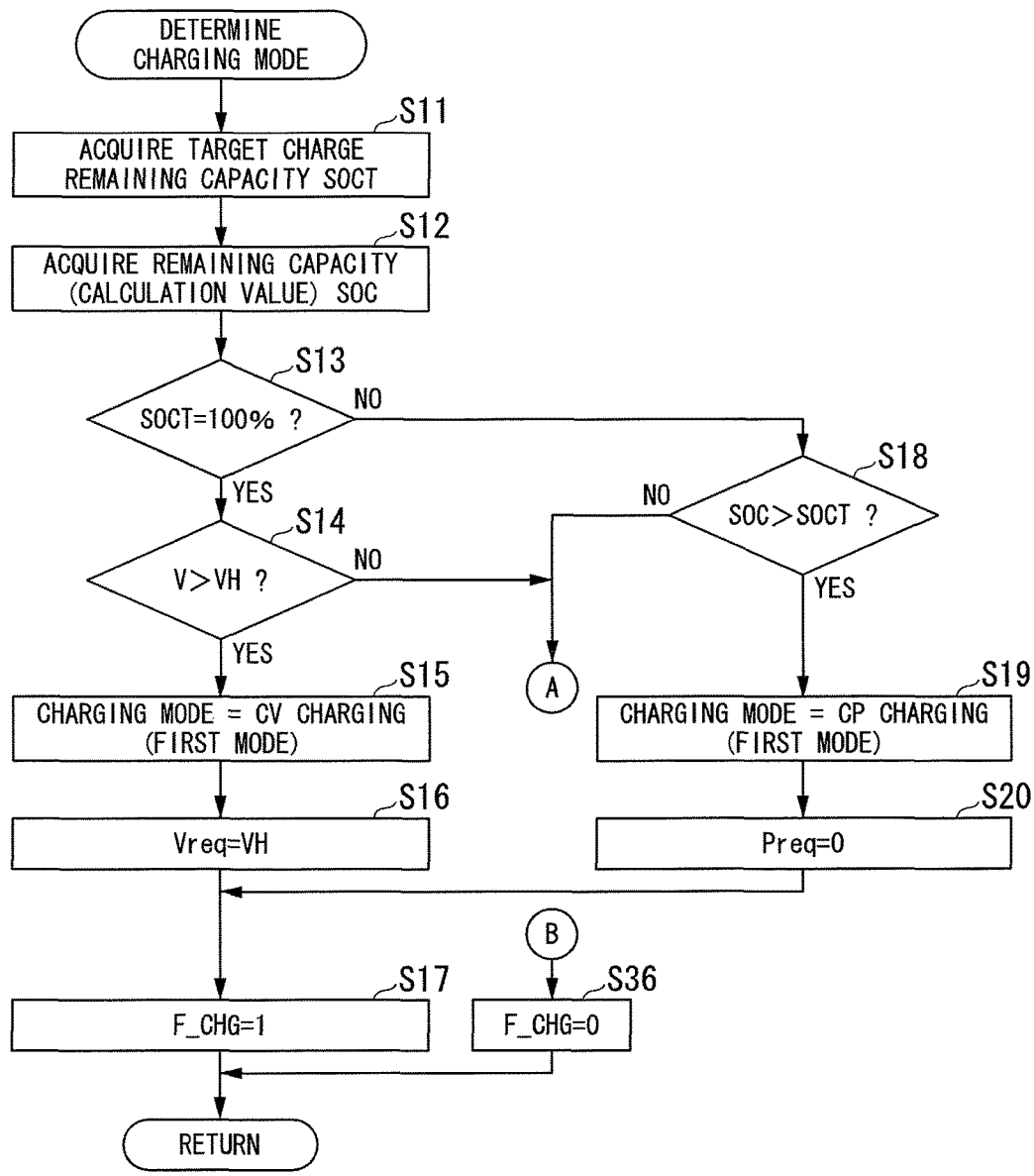
FIG. 10 is a diagram illustrating a charging mode determining process according to the embodiment of the invention.

For example, in step S11 shown in FIG. 10, a target value (a target charge remaining capacity) SOCT of the remaining capacity SOC of the secondary battery 11 when the secondary battery 11 is charged by the external charger 1 is acquired.

Next, in step S12, a calculation result of the remaining capacity SOC that is output from the remaining capacity calculating unit 35 is acquired.

Next, in step S13, it is determined whether or not the target charge remaining capacity SOCT is 100%.

In a case where this determination result is "NO", the process proceeds to step S18 to be described later.

On the other hand, in a case where this determination result is "YES", the process proceeds to step S14.

In step S14, it is determined whether or not the voltage sensor output V is larger than a predetermined upper limit voltage VH that is set with respect to the secondary battery 11.

In a case where this determination result is "NO", the process proceeds to step S31 in FIG. 11 to be described later.

On the other hand, in a case where this determination result is "YES", the process proceeds to step S15.

In step S15, as a charging mode, a first mode by a constant voltage (CV) charging in which charging power of a fixed voltage is continuously output is set.

Next, in step S16, the upper limit voltage VH is set as a request voltage Vreq in the constant voltage (CV) charging.

Next, in step S17, "1" is set to a flag value of a charging completion flag, and the process proceeds to return.

In addition, in step S18, it is determined whether or not the remaining capacity SOC is larger than the target charge remaining capacity SOCT.

In a case where this determining result is "NO", the process proceeds to step S31 in FIG. 11 described later.

On the other hand, in a case where this determination result is "YES", the process proceeds to step S19.

In step S19, as the charging mode, a first mode by constant power (CP) charging in which fixed charging power such as normal rated power CPa is continuously output is set.

Next, in step S20, zero is set as request power Preq in the constant power (CP) charging, and the process proceeds to step S17 described above.

Figure 11:
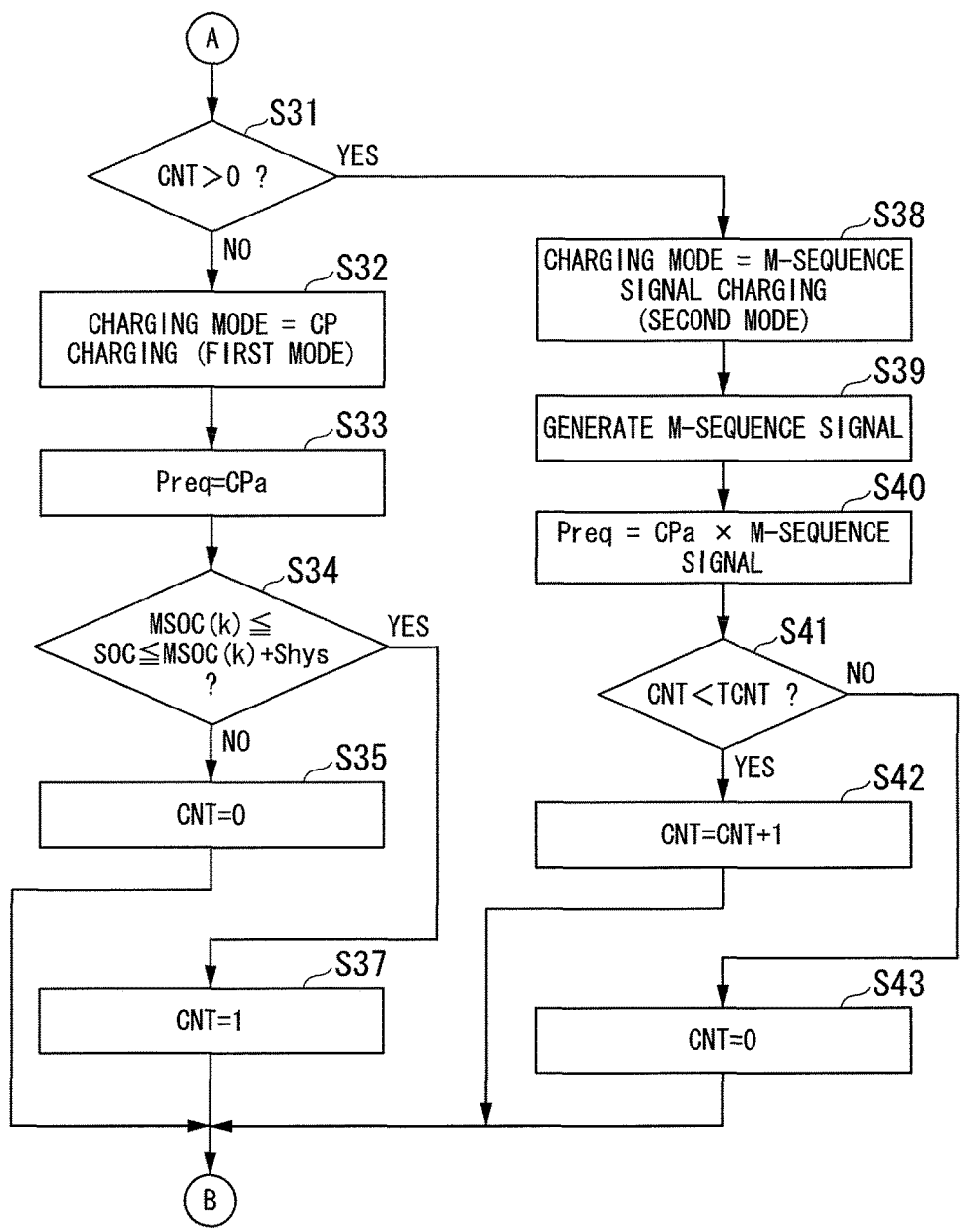
FIG. 11 is a diagram illustrating a charging mode determining process according to the embodiment of the invention.

In addition, for example, in step S31 shown in FIG. 11, it is determined whether or not the number of execution times CNT of the second mode is larger than zero.

In a case where the determination result is "YES", the process proceeds to step S38 described later.

On the other hand, in a case where the determination result is "NO", the process proceeds to step S32.

In addition, in step S32, as the charging mode, a first mode by constant power (CP) charging in which fixed charging power such as normal rated power CPa is continuously output is set.

Next, in step S33, predetermined normal rated power CPa is set as request power Preq in the constant power (CP) charging.

Next, in step S34, for example, in a case where the execution of the second mode is instructed at a timing whenever the remaining capacity SOC reaches a predetermined remaining capacity MSOC after a charging initiation time, with respect to a predetermined remaining capacity MSOC (k) and a predetermined hysteresis Shys in the second mode that is executed in a $k^{th}$ time, it is determined whether or not the remaining capacity SOC is larger than or equal to the predetermined remaining capacity MSOC (k), and is less than or equal to the sum of the predetermined remaining capacity MSOC (k) and hysteresis Shys. In addition, the predetermined remaining capacity MSOC (k) is, for example, (10×k) % or the like.

In a case where this determination result is "NO", the process proceeds to step S35. In step S35, the number of execution times CNT of the second mode is set to zero, and the process proceeds to step S36 in FIG. 10. In step S36, the flag value of the charging completion flag is set to "0", and the process proceeds to return.

On the other hand, in a case where the determination result is "YES", the process proceeds to step S37. In step S37, the number of execution times CNT of the second mode is set to "1", and the process proceeds to step S36 in FIG. 10.

In addition, in step S38, as the charging mode, for example, a second mode by an M-sequence signal is set.

Next, in step S39, the M-sequence signal is generated.

Next, in step S40, a value, which may be obtained by multiplying predetermined normal rated power CPa as the request power Preq in the charging by this M-sequence signal by the M-sequence signal, is set.

Next, in step S41, it is determined whether or not the number of execution times CNT of the second mode is less than a predetermined upper limit number of times TCNT.

In a case where this determination result is "YES", the process proceeds to step S42, and in step S42, a value, which may be obtained by adding "1" to the number of execution times CNT of the second mode, is newly set as the number of execution times CNT of the second mode, and the process proceeds to step S36 in FIG. 10.

On the other hand, in a case where the determination result is "NO", the process proceeds to step S43. In step S43, the number of execution times CNT of the second mode is set to zero, and the process proceeds to step S36 in FIG. 10.

Hereinafter, a battery capacity calculation process of calculating the full charge capacity CAPA of the secondary battery 11 will be described.

In addition, this process is repeatedly executed, for example, in a predetermined computation cycle Ts (s).

Figure 12:
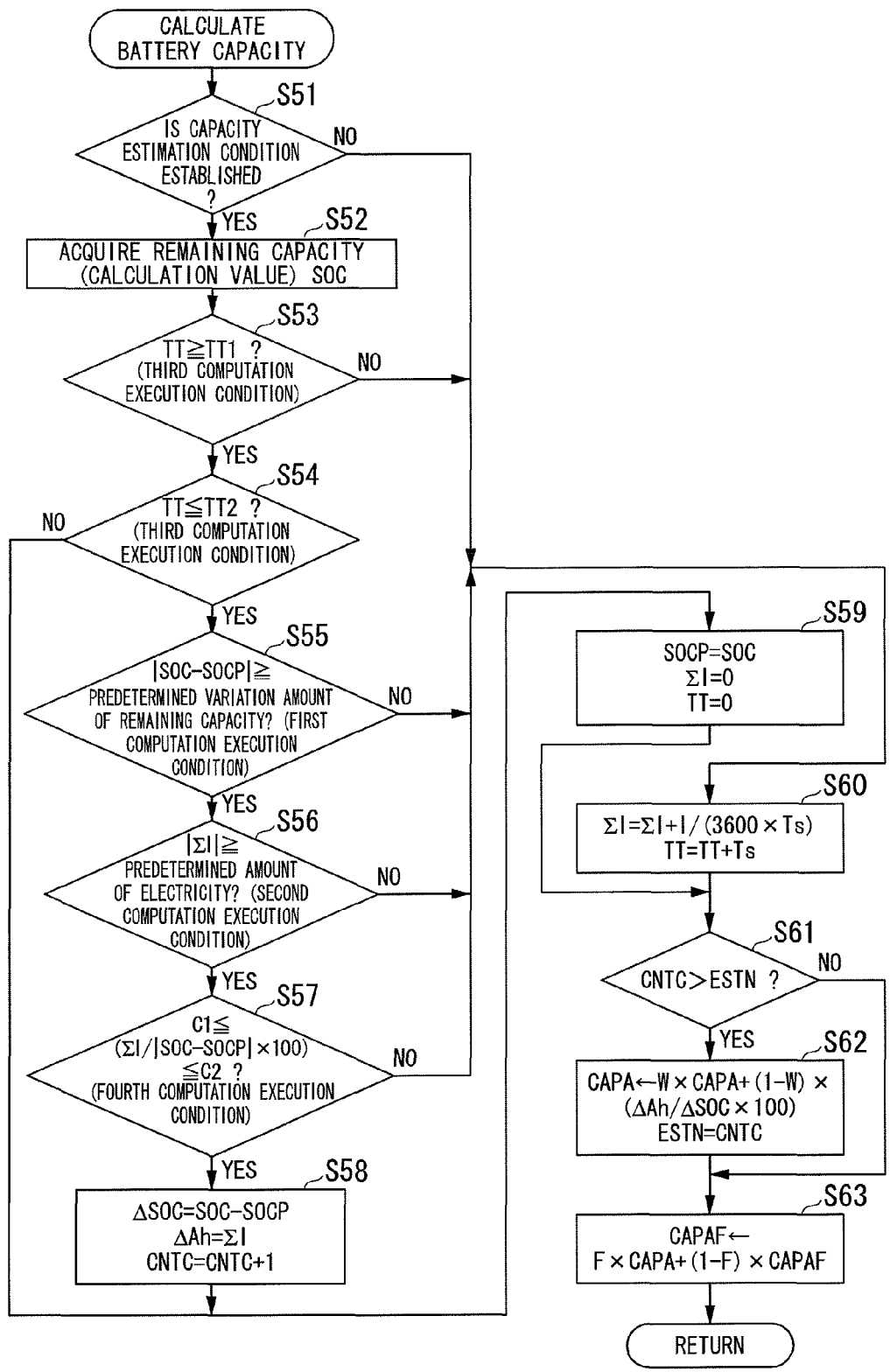
FIG. 12 is a diagram illustrating a battery capacity calculating process according to the embodiment of the invention.

First, for example, in step S51 shown in FIG. 12, it is determined whether or not any capacity estimation condition including at least a first capacity estimation condition is established, among first to sixth capacity estimation conditions.

In a case where this determination result is "NO", the process proceeds to step S60 to be described later.

On the other hand, in a case where the determination result is "YES", the process proceeds to step S52.

In addition, in step S52, a calculation result, which is output from the remaining capacity calculating unit 35, of the remaining capacity SOC is acquired.

Next, in step S53, as part of the above-described third computation execution condition, it is determined whether or not the elapsed time TT from the immediately previous full charge capacity calculation time is longer than or equal to a predetermined first time TT1.

In a case where this determination result is "NO", the process proceeds to step S60 to be described later.

On the other hand, in a case where the determination result is "YES", the process proceeds to step S54.

In addition, in step S54, as part of the above-described third computation execution condition, it is determined whether or not the elapsed time TT from the immediately previous full charge capacity calculation time is less than or equal to a predetermined second time TT2.

In a case where this determination result is "NO", the process proceeds to step S59 to be described later.

On the other hand, in a case where the determination result is "YES", the process proceeds to step S55.

In addition, in step S55, as the above-described first computation execution condition, it is determined whether or not the variation amount ΔSOC (=|SOC−SOCP|) of the remaining capacity SOC from the immediately previous full charge capacity calculation time is greater than or equal to a predetermined variation amount of the remaining capacity.

In a case where this determination result is "YES", the process proceeds to step S56.

On the other hand, in a case where the determination result is "NO", the process proceeds to step S60 to be described later.

In step S56, as the above-described second computation execution condition, it is determined whether or not the amount of electricity n that is the integrated value of the current sensor output I after the error correction from the immediately previous full charge capacity calculation time is greater than or equal to a predetermined amount of electricity.

In a case where this determination result is "YES", the process proceeds to step S57.

On the other hand, in a case where the determination result is "NO", the process proceeds to step S60 to be described later.

In step S57, as the above-described fourth computation execution condition, it is determined whether or not the capacity calculation value C0, which is described as shown in Expression (5) described above, is within a predetermined capacity range (C2≥C0≥C1).

In a case where this determination result is "YES", the process proceeds to a process of calculating a variation amount of the remaining capacity (step S58).

On the other hand, in a case where the determination result is "NO", the process proceeds to step S60 to be described later.

In step S58, the following values are stored. The stored values include the variation amount ΔSOC (=|SOC−SOCP|) of the remaining capacity SOC from the most recent full charge capacity calculation time, a variation amount of electricity ΔAh from the most recent full charge capacity calculation time (=an amount of charged electricity (an amount of electricity ΣI) that is an integrated value of the current sensor output I after the error correction of the current that has flowed from the most recent full charge capacity calculation time), and the number of calculation times CNTC of a new present full charge capacity, which is a value obtained by adding "1" to the number of calculation times CNTC of a present full charge capacity.

Next, in step S59, the remaining capacity SOCP that is an immediately previous value is set to the remaining capacity SOC that is a present value, and the amount of electricity ΣI and the elapsed time TT are initialized to be zero, and then the process proceeds to step S61 to be described later.

In step S60, a value (ΣI+I/(3600×Ts)), which is obtained by adding a present value of the current sensor output I (s) after the error correction to an immediately previous value of the amount of electricity ΣI is set to a present value of the amount of electricity ΣI(A·h). In addition, a value, which is obtained by correlating a predetermined computation cycle Ts to an immediately previous value of the elapsed time TT, is set to a present value of the elapsed time TT.

Next, in step S61, it is determined whether or not the number of calculation times CNTC of the present full charge capacity is larger than the number of calculation times ESTN of the immediately previous full charge capacity.

In a case where this determination result is "NO", the process proceeds to a full charge capacity detection process (step S63) to be described later.

On the other hand, in a case where the determination result is "YES", the process proceeds to step S62.

In addition, in step S62, a value (W×CAPA+(1−W)×(ΔAh/ΔSOC×100)), which is obtained by adding a value (W×CAPA) that is obtained by multiplying the full charge capacity CAPA (that is, the immediately previous value of the full charge capacity CAPA) at the immediately previous full charge capacity calculation time by an arbitrary weighting factor W (0≤W≤1) to a value ((1−W)×(ΔAh/ΔSOC× 100)) that is obtained by dividing the variation amount ΔAh of the amount of electricity by the variation amount ΔSOC of the remaining capacity SOC and by multiplying the resultant value by 100 and by multiplying the resultant value by a value (1−W) according to the weighting factor W, is set to a present value of the full charge capacity CAPA. In addition, the number of calculation times ESTN of the immediately previous full charge capacity is newly set by the number of calculation times CNTC of the present full charge capacity, and the process proceeds to step S63.

In addition, in step S63, a value (F×CAPA+(1−F)×CAPAF), which is obtained by adding a value that is obtained by multiplying a present value CAPA of the full charge capacity by an arbitrary filter coefficient F (0≤F≤1), to a value that is obtained by multiplying a full charge capacity CAPAF after the filtering process at the immediately previous full charge capacity calculation time by a value (1−F) according to the filter coefficient F, is detected as a present value of the full charge capacity CAPAF of the secondary battery 11 after the filtering process. Then, the process proceeds to return.

Hereinafter, a current sensor error correction process (current sensor error correction (during charging)) of correcting an error of the current sensor 19 in the first period during the charging execution by the external charger 1 will be described.

Figure 13:
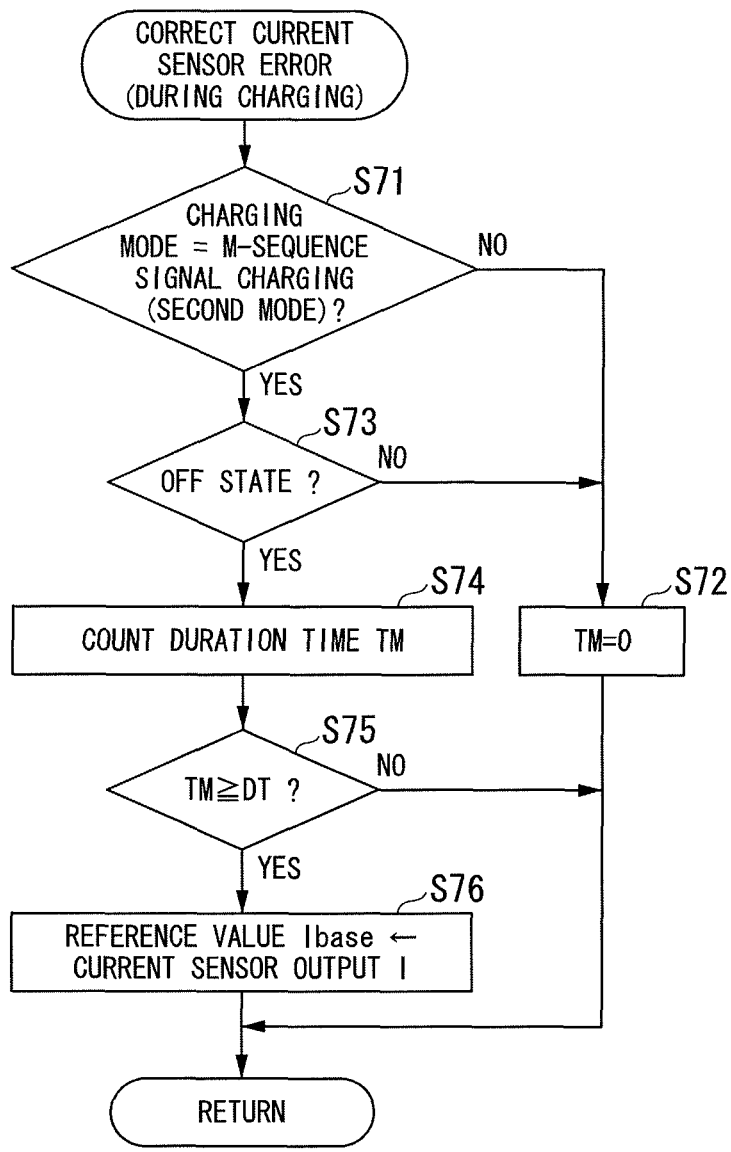
FIG. 13 is a diagram illustrating a process of correcting an error of the current sensor in a first period according to the embodiment of the invention.

First, for example, in step S71 shown in FIG. 13, it is determined whether or not as the charging mode, for example, the second mode by the M-sequence signal is set.

In a case where this determination result is "NO", the process proceeds to step S72. In step S72, the duration time TM is set to zero and the process proceeds to return.

On the other hand, in a case where the determination result is "YES", the process proceeds to step S73.

In step S73, it is determined whether or not it is the OFF state in which the power transmission of stopped.

In a case where this determination result is "NO", the process proceeds to the above-described step S72.

On the other hand, in a case where the determination result is "YES", the duration time TM of the OFF state is counted.

In step S75, it is determined whether or not the duration time TM of the OFF state is greater than or equal to a predetermined delay time DT.

In a case where this determination result is "NO", the process proceeds to return.

On the other hand, in a case where this determination result is "YES", the process proceeds to step S76.

In addition, in step S76, the current sensor output I is newly set as a reference value Ibase that corresponds to a zero point (a position of 0 A) of the current sensor 19, and the process proceeds to return.

Hereinafter, the current sensor error correction (during traveling) process of correcting the error of the current sensor 19 in the second period including at least the traveling time of the electrically driven vehicle 10 will be described.

Figure 14:
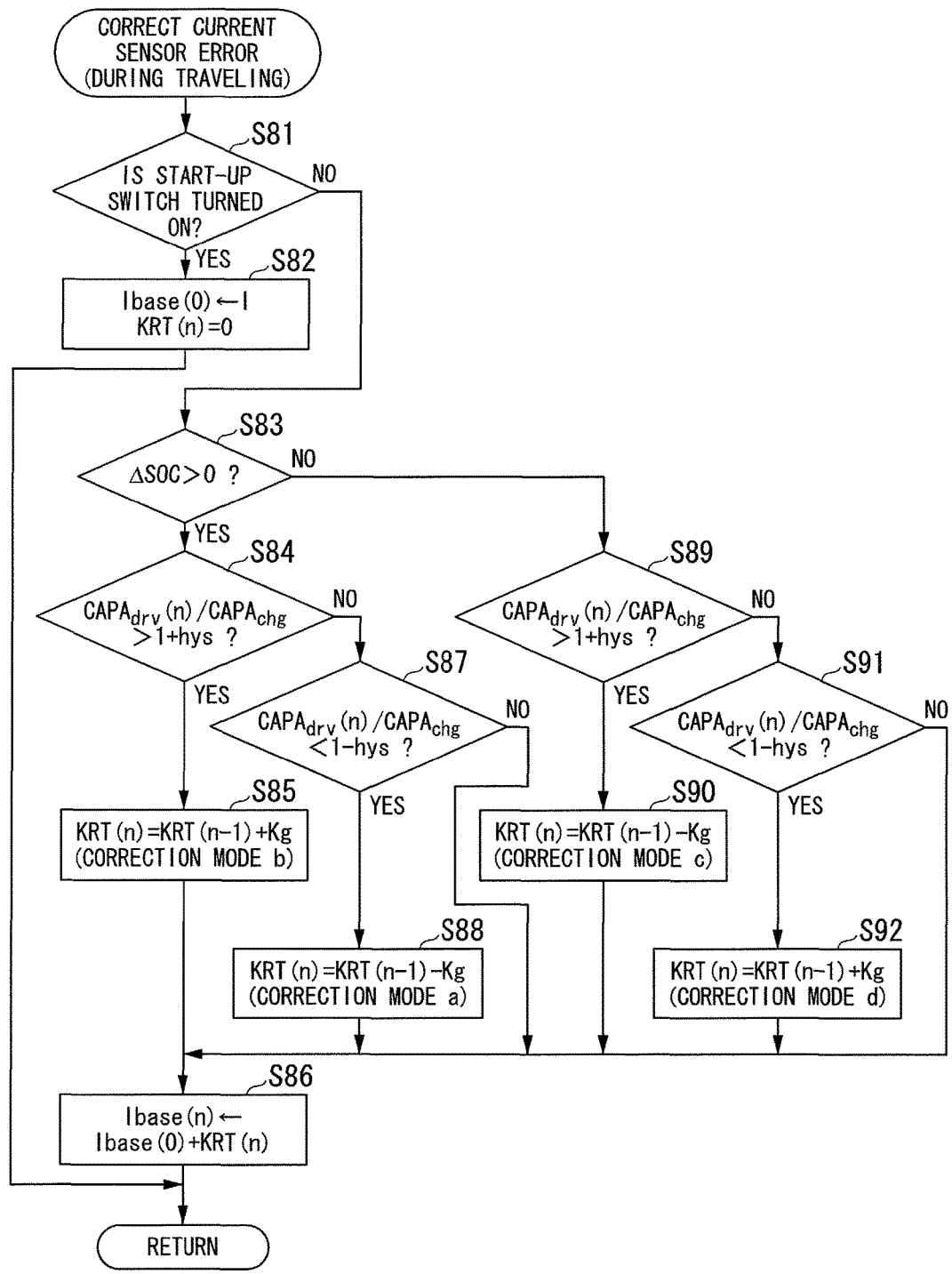
FIG. 14 is a diagram illustrating a process of correcting an error of the current sensor in a second period according to the embodiment of the invention.

First, for example, in step S81 shown in FIG. 14, it is determined whether or not a start-up switch that instructs the start-up of the electrically driven vehicle 10 is turned on.

In a case where this determination result is "YES", the process proceeds to step S82. In step S82, the current sensor output I is set to a reference value Ibase (0) at the time of start-up, and a present correction value KRT (n) according to an arbitrary natural number n that represents the number of times in which the correction process in the second period is executed is set to zero. Then, the process proceeds to return.

On the other hand, in a case where the determination result is "NO", the process proceeds to step S83.

In step S83, it is determined whether or not the variation amount (variation amount of the remaining capacity) ΔSOC of the remaining capacity SOC for an appropriate period in the second period is larger than zero.

In a case where this determination result is "NO", the process proceeds to step S89 to be described later.

On the other hand, in a case where the determination result is "YES", the process proceeds to step S84.

In addition, in step S84, it is determined whether or not the full charge capacity ratio (=CAPAdrv/CAPAchg) of the full charge capacity CAPAdrv in the second period and the full charge capacity CAPAchg is larger than a value (1+hys) having appropriate hysteresis hys with respect to "1". The full charge capacity CAPAdrv is calculated based on an absolute value |ΣI| of a current integrated value for the appropriate period in the second period. In addition, the full charge capacity CAPAchg is the full charge capacity CAPA that is a calculation result output from the battery capacity calculating unit 38 in the first period.

In a case where this determination result is "NO", the process proceeds to step S87 to be described later.

On the other hand, in a case where the determination result is "YES", the process proceeds to step S85.

In addition, in step S85, a value, which is obtained by adding the predetermined correction gain Kg to the immediately previous correction value KRT (n−1) as the above-described correction mode b, is set as the present correction value KRT (n).

Next, in step S86, the reference value Ibase (n), which is set by an $n^{th}$ correction process according to an arbitrary natural number n, of the current sensor output I is set to a value that is obtained by adding the correction value KRT (n) to the reference value Ibase (0) at the time of start-up, and the process proceeds to return.

In addition, in step S87, it is determined whether or not the full charge capacity ratio (=CAPAdrv/CAPAchg) of the full charge capacity CAPAdrv in the second period and the full charge capacity CAPAchg in the first period is less than a value (1−hys) having appropriate hysteresis hys with respect to "1".

In a case where this determination result is "NO", the process proceeds to step S86 described above.

On the other hand, in a case where this determination result is "YES", the process proceeds to step S88.

In step S85, a value, which is obtained by subtracting the predetermined correction gain Kg from the immediately previous correction value KRT (n−1) as the above-described correction mode a, is set as the present correction value KRT (n), and the process proceeds to step S86 described above.

In addition, in step S89, it is determined whether or not the full charge capacity ratio (=CAPAdrv/CAPAchg) of the full charge capacity CAPAdrv in the second period and the full charge capacity CAPAchg in the first period is larger than a value (1+hys) having appropriate hysteresis hys with respect to "1".

In a case where this determination result is "NO", the process proceeds to step S91 described above.

On the other hand, in a case where the determination result is "YES", the process proceeds to step S90.

In step S90, a value, which is obtained by subtracting the predetermined correction gain Kg from the immediately previous correction value KRT (n−1) as the above-described correction mode c, is set as the present correction value KRT (n), and the process proceeds to step S86 described above.

In step S91, it is determined whether or not the full charge capacity ratio (=CAPAdrv/CAPAchg) of the full charge capacity CAPAdrv in the second period and the full charge capacity CAPAchg in the first period is less than a value (1−hys) having appropriate hysteresis hys with respect to "1".

In a case where this determination result is "NO", the process proceeds to step S86 described above.

On the other hand, in a case where this determination result is "YES", the process proceeds to step S92.

In addition, in step S92, a value, which is obtained by adding the predetermined correction gain Kg to the immediately previous correction value KRT (n−1) as the above-described correction mode d, is set as the present correction value KRT (n), and the process proceeds to step S86 described above.

As described above, according to the method of detecting the battery capacity of the secondary battery according to this embodiment of the invention, the charging mode when the secondary battery 11 is charged by the charger 1 includes the ON state in which the charging power is transmitted, and the OFF state (a power transmission stoppage state that may be actively performed at an appropriate timing) in which the transmission of the charging power is temporarily stopped, and the internal resistance R is sequentially calculated when the ON state and the OFF state are switched from each other. Therefore, a computation error due to a variation in an offset characteristic, a hysteresis characteristic, or the like may be prevented from accumulating, and thus detection accuracy of the open voltage $V_O$ and the full charge capacity CAPA of the secondary battery 11 may be prevented from being decreased. Therefore, even when a correspondence relationship between a charge and discharge current and the open voltage $V_O$ of the secondary battery 11 varies from a correspondence relationship which is set in advance in a function or a table due to a variation in characteristics of the secondary battery 11, the detection error of the open voltage $V_O$ may be suppressed. Therefore, the internal resistance R of the secondary battery 11 is calculated with high accuracy. In addition, since the point of time at which the ON state and the OFF state are switched from each other is set as a detection timing of the open voltage $V_O$ instead of a timing at which the charge and discharge current of the secondary battery 11 becomes zero like the related art, the calculation accuracy of the open voltage $V_O$ is improved. In addition, since a main cause of disturbance, for example, a high load current or the like is prevented during the charging by the charger 1, calculation accuracy of the internal resistance R, the open voltage $V_O$, and the amount of electricity ΣI is further improved compared to a case in which the open voltage $V_O$ or the like is detected at the detection timing in the related art. As a result, the detection accuracy of the full charge capacity CAPA of the secondary battery 11 may be improved.

In addition, the open voltage $V_O$ or the like may be detected by temporarily stopping the power transmission in the OFF state without stopping the transmission of the charging power for a long time so as to detect the open voltage $V_O$. Therefore, power is supplied to a load such as the motor 12 from the secondary battery 11, and thus a load state (for example, a driving state or the like of the motor 12) at the time of discharge is prevented from varying.

Furthermore, the internal resistance R is calculated whenever the ON state and the OFF state are switched from each other within one cycle of the second mode, and the charging power having a pulse wave (pulse wave in which repetitive frequencies of the ON state and the OFF state are different from each other) in which duration times of the ON state and the OFF state are different from each other is transmitted, and thus, for example, the internal resistance R may be calculated with high accuracy on the basis of a separate frequency corresponding to the variation in characteristics of the secondary battery 11, occurrence of various main causes of disturbance, or the like.

Furthermore, since the error of the current sensor 19 is sequentially corrected by the detection result (the current sensor output I) that is output from the current sensor 19 at the time of the OFF state (the power transmission stoppage state that may be actively executed at an appropriate timing) in the second mode, a frequency of execution of the correction may be prevented from being decreased. Therefore, since in the calculation result of the amount of electricity ΣI that is based on the detection result that is output from the current sensor 19, the accumulation of the error of the current sensor 19 may be suppressed and thus the detection accuracy of the full charge capacity CAPA of the secondary battery 11 may be improved.

Furthermore, since the correction is performed using a value that is obtained by averaging the current sensor 19 errors, which are detected within one cycle of the second mode, correction accuracy may be improved. Therefore, detection accuracy of the full charge capacity CAPA of the secondary battery may be improved.

Furthermore, a detection value of the present full charge capacity CAPA (m) is detected by using an arbitrary weighting factor W with respect to a previous detection value (for example, a full charge capacity CAPA (m−1)) that is at least an immediately previous detection value and a present detection value (for example, a full charge capacity (m)). Therefore, the followability and the stability of the detection result of the full charge capacity may be selected in response to an object. As a result, for example, in a detection initial stage, the followability with respect to various present quantities of states may be prioritized by increasing the weighting of the present detection value. In addition, for example, in a case where the number of detection times increases, in a case where a variation in various quantities of states are significantly uneven, or the like, the stability of the detection result may be prioritized by increasing the weighting of the previous detection value such as an immediately previously detection value.

Furthermore, since the filtering process by an arbitrary filter coefficient F is performed, the variation in the detection result of the full charge capacity CAPA may be made to be smooth.

Furthermore, since the variation amounts ΔV and ΔI of the voltage (the voltage sensor output V) and the current (the current sensor output I) when the ON state and the OFF state are switched from each other are used in the calculation of the internal resistance value, a variation in characteristics due to a variation with the elapse of time in the secondary battery 11, a variation in a temperature of the secondary battery, or the like may be appropriately reflected on the internal resistance value. Therefore, the internal resistance R may be calculated with high accuracy, whereby calculation accuracy of the open voltage $V_O$ based on the internal resistance R and the remaining capacity SOC based on the open voltage $V_O$ may be improved.

Furthermore, the most recent data is immediately reflected by the iterative least square method, previous data is arbitrarily excluded, and thus the calculation accuracy of the internal resistance R may be improved.

Furthermore, in a case where a difference between a voltage computation value (for example, the open voltage $V_O$), which is computed based on the equivalent circuit model 50, of the secondary battery 11 and a detection result (voltage sensor output V) of the voltage, which is output from the voltage sensor 18, of the secondary battery 11 is less than or equal to a predetermined threshold value, it is determined that the calculation accuracy and reliability of the open voltage $V_O$ is greater than or equal to a constant degree. Therefore, since the full charge capacity is calculated when the difference between the voltage computation value of the secondary battery 11 and the detection result of the voltage of the secondary battery 11 is less than or equal to a predetermined threshold value, the calculation accuracy and reliability of the remaining capacity SOC based on the open voltage $V_O$ and the full charge capacity CAPA based on the remaining capacity SOC may be improved.

That is, in a case where the internal resistance R is calculated based on the equivalent circuit model 50, it may be determined that the modeling of the actual operation of the secondary battery 11 is performed with high accuracy by the equivalent circuit model 50. Therefore, in a case where among the plurality of first to sixth capacity estimation conditions, any capacity estimation condition including at least the first capacity estimation condition is established, it is reflected on the open voltage $V_O$ on which the internal resistance R with high accuracy is reflected. Therefore, the calculation accuracy of the remaining capacity SOC by the open voltage $V_O$ may be improved and thus the calculation error of the full charge capacity CAPA may be reduced.

In addition, in the above-described embodiment, a description was made with respect to a case in which the internal resistance computing unit 42 calculates the internal resistance R of the secondary battery 11 by the iterative least square method based on the variation amounts ΔV (k) and ΔI (k) when the ON state and the OFF state are switched form each other, but the calculation of the internal resistance is not limited thereto. In a case where desired calculation accuracy may be secured, the internal resistance R may be calculated by a different calculation method.

In addition, in the above-described embodiment, in the correction in the second period to correct the error of the current sensor 19, the full charge capacity CAPAdrv in the second period may be calculated by a computation process different from that of the full charge capacity CAPAchg in the first period. In addition, the full charge capacity CAPAdrv in the second period may be set to a full charge capacity that is calculated by a different computation process without being set to the full charge capacity CAPA that is output from the battery capacity calculating unit 38 in the second period.

REFERENCE SIGNS LIST

1: Charger
10: Electrically driven vehicle
11: Secondary battery
16: Battery ECU
18: Voltage sensor
19: Current sensor
20: Temperature sensor
31: Charging mode determining unit
32: Communication unit
33: Current sensor error correcting unit
34: Capacity estimation condition establishment determining unit
35: Remaining capacity calculating unit
36: Current integration calculating unit
37: Computation execution condition establishment determining unit
38: Battery capacity calculating unit step
S02: Internal resistance calculation process step S04: Remaining capacity calculation process step
S11 to S22, and S31 to S37: Charging mode selection process step
S58: Remaining capacity variation amount calculation process, amount of charged electricity calculation process step
S63: Full charge capacity detection process step
S71 to S76: Current sensor error correction process

The invention claimed is:

1. A method of detecting a battery capacity of a secondary battery that is mounted on an electrically driven vehicle that is capable of being charged by an external charger, in which a charging mode when the secondary battery is charged by the external charger includes a first mode including only an ON state in which a power transmission of a charging power is performed, and a second mode including the ON state and an OFF state in which the power transmission is temporarily stopped, the method comprising:
 a charging mode selection process of selecting the charging mode while the charging by the external charger is performed;
 an internal resistance calculation process of calculating an internal resistance of the secondary battery by using variation amounts of a voltage and a current of the secondary battery when the ON state and the OFF state are switched from each other, in a case where the second mode is selected in the charging mode selection process, and the second mode includes temporarily stopping the power transmission in the OFF state for a plurality of times;
 a remaining capacity calculation process of calculating an open voltage of the secondary battery based on the internal resistance and calculating a remaining capacity of the secondary battery from the open voltage that is a result of the calculation;
 a remaining capacity variation amount calculation process of calculating a variation amount of the remaining capacity from a most recent full charge capacity calculation time;
 a charged electricity amount calculation process of calculating an amount of charged electricity in accordance with an integrated value of the current that flowed from a point of time at which the most recent full charge capacity is calculated; and
 a full charge capacity detection process of detecting a full charge capacity of the secondary battery based on the variation amount of the remaining capacity and the amount of the charged electricity;
  wherein in the full charge capacity detection process, a value, which is obtained by multiplying a present detection value of the full charge capacity that is detected based on the variation amount of the remaining capacity and the amount of the charged electricity and at least a most recent detection value of the full charge capacity by an arbitrary weighting factor, is newly set to a present detection value of the full charge capacity,
  and
  an instruction of an execution of the second mode by the charging mode selection process is performed based on the calculated variation amount of an increase of the remaining capacity.

2. The method according to claim 1, further comprising:
 a current sensor error correction process of detecting an error of a current sensor from a detection result of the current, which is output from the current sensor that detects the charging and discharging current of the secondary battery, in the OFF state, and performing correction by using the error, in a case where the second mode is selected in the charging mode selection process.

3. The method according to claim 2,
 wherein in the current sensor error correction process, the error is detected whenever the ON state transitions to the OFF state, and the correction is performed using a value that is obtained by averaging the errors that are detected within the second mode.

4. The method according to claim 1,
 wherein in a case where the second mode is selected in the charging mode selection process,
 the charging by the external charger is performed by transmission of the charging power having a pulse wave in which duration times of the ON state and the OFF state are different from each other,
 in the internal resistance calculation process, the internal resistance is calculated whenever the ON state and the OFF state are switched from each other, and
 in the remaining capacity calculation process, the open voltage is calculated using the internal resistance that is calculated in the internal resistance calculation process within the second mode.

5. The method according to claim 1,
 wherein in the internal resistance calculation process, a value of the internal resistance is calculated using a variation amount of the current when the ON state and the OFF state are switched from each other, and a variation amount of a voltage, which is output from a voltage sensor that detects the voltage of the secondary battery, when the ON state and the OFF state are switched from each other.

6. The method according to claim 1,
 wherein in the remaining capacity calculation process, in a case where a difference between a voltage computation value, which is computed based on an equivalent circuit model, of the secondary battery and a detection result of a voltage output from a voltage sensor that detects the voltage of the secondary battery is less than or equal to a predetermined threshold value, the remaining capacity is calculated.

7. A method of detecting a battery capacity of a secondary battery that is mounted on an electrically driven vehicle that is capable of being charged by an external charger, in which a charging mode when the secondary battery is charged by the external charger includes a first mode including only an ON state in which a power transmission of a charging power is performed, and a second mode including the ON state and an OFF state in which the power transmission is temporarily stopped, the method comprising:
 a charging mode selection process of selecting the charging mode while the charging by the external charger is performed;
 a current sensor error correction process, performed by an electronic control unit, of detecting an error of a current sensor from a detection result of the current, which is output from the current sensor that detects the charging and discharging current of the secondary battery, in the OFF state, and performing correction by using the error, in a case where the second mode is selected in the charging mode selection process, and the second mode includes temporarily stopping the power transmission in the OFF state for a plurality of times;
 an internal resistance calculation process of calculating an internal resistance of the secondary battery by using variation amounts of a voltage and a current of the secondary battery when the ON state and the OFF state are switched from each other, in a case where the second mode is selected in the charging mode selection process;

a remaining capacity calculation process of calculating an open voltage of the secondary battery based on the internal resistance and calculating a remaining capacity of the secondary battery from the open voltage that is a result of the calculation;

a remaining capacity variation amount calculation process of calculating a variation amount of the remaining capacity from a most recent full charge capacity calculation time;

a charged electricity amount calculation process of calculating an amount of charged electricity in accordance with an integrated value of the current that flowed from a point of time at which the most recent full charge capacity is calculated; and a full charge capacity detection process of detecting a full charge capacity of the secondary battery based on the variation amount of the remaining capacity and the amount of the charged electricity, wherein an instruction of an execution of the second mode by the charging mode selection process is performed based on the calculated variation amount of an increase of the remaining capacity.

8. The method according to claim 7, wherein in a case where the second mode is selected in the charging mode selection process, the charging by the external charger is performed by transmission of the charging power having a pulse wave in which duration times of the ON state and the OFF state are different from each other, in the internal resistance calculation process, the internal resistance is calculated whenever the ON state and the OFF state are switched from each other, and in the remaining capacity calculation process, the open voltage is calculated using the internal resistance that is calculated in the internal resistance calculation process within the second mode.

9. The method according to claim 7, wherein in the current sensor error correction process, the error is detected whenever the ON state transitions to the OFF state, and the correction is performed using a value that is obtained by averaging the errors that are detected within the second mode.

10. The method according to claim 7, wherein in the full charge capacity detection process, a value, which is obtained by multiplying a present detection value of the full charge capacity that is detected based on the variation amount of the remaining capacity and the amount of the charged electricity and at least a most recent detection value of the full charge capacity by an arbitrary weighting factor, is newly set to a present detection value of the full charge capacity.

11. The method according to claim 7, wherein in the internal resistance calculation process, a value of the internal resistance is calculated using a variation amount of the current when the ON state and the OFF state are switched from each other, and a variation amount of a voltage, which is output from a voltage sensor that detects the voltage of the secondary battery, when the ON state and the OFF state are switched from each other.

12. The method according to claim 7, wherein in the remaining capacity calculation process, in a case where a difference between a voltage computation value, which is computed based on an equivalent circuit model, of the secondary battery and a detection result of a voltage output from a voltage sensor that detects the voltage of the secondary battery is less than or equal to a predetermined threshold value, the remaining capacity is calculated.

\* \* \* \* \*